United States Patent [19]
Miller et al.

[11] Patent Number: 5,363,031
[45] Date of Patent: Nov. 8, 1994

[54] FAST BATTERY CHARGER

[75] Inventors: Phillip Miller, Cedar Rapids; Ronald D. Becker, Des Moines; Steven E. Koenck, Cedar Rapids, all of Iowa

[73] Assignee: Norand Corporation, Cedar Rapids, Iowa

[21] Appl. No.: 859,591

[22] Filed: Mar. 23, 1992

Related U.S. Application Data

[60] Continuation-in-part of Ser. No. 446,231, Dec. 5, 1989, abandoned, Division of Ser. No. 478,180, Feb. 9, 1990, abandoned.

[51] Int. Cl.$^5$ ................................................. H02J 7/04
[52] U.S. Cl. ........................................ 320/21; 320/35; 320/43
[58] Field of Search .................... 320/21, 31, 32, 35, 320/36, 39, 40, 43, 48, 22, 23, 24, 20

[56] References Cited

U.S. PATENT DOCUMENTS

| | | | |
|---|---|---|---|
| 3,599,071 | 8/1971 | Lapuyade et al. | 320/35 |
| 3,911,350 | 10/1975 | Swope | 320/35 X |
| 3,917,990 | 11/1975 | Sherman, Jr. | 320/35 |
| 4,125,802 | 11/1978 | Godard | 320/35 |
| 4,237,411 | 12/1980 | Kothe et al. | 320/21 |
| 4,308,493 | 12/1981 | Kothe et al. | 320/35 |
| 4,346,336 | 8/1982 | Crawford | 320/35 X |
| 4,370,606 | 1/1983 | Kakumoto et al. | 320/35 |
| 4,424,476 | 1/1984 | Mullersman | 320/36 |
| 4,455,523 | 6/1984 | Koenck | 320/43 |
| 4,553,081 | 11/1985 | Koenck | 320/43 |
| 4,607,208 | 8/1986 | Vreeland | 320/35 X |
| 4,649,333 | 3/1987 | Moore | 320/35 X |
| 4,670,703 | 6/1987 | Williams | 320/31 X |
| 4,692,682 | 9/1987 | Lane et al. | 320/35 |
| 4,709,202 | 11/1987 | Koenck et al. | 320/43 |
| 4,716,354 | 12/1987 | Hacker | 320/39 |
| 4,829,226 | 5/1989 | Nakamura et al. | 320/35 |
| 4,833,390 | 5/1989 | Kumada et al. | 320/2 |
| 4,885,523 | 12/1989 | Koenck | 320/32 |
| 5,013,993 | 5/1991 | Bhagwat et al. | 320/35 |

FOREIGN PATENT DOCUMENTS

| | | |
|---|---|---|
| 2520599 | 11/1976 | Germany . |
| WO-A-8902182 | 3/1989 | WIPO . |

Primary Examiner—Kristine L. Peckman
Attorney, Agent, or Firm—McAndrews, Held & Malloy, Ltd.

[57] ABSTRACT

In an exemplary fast charging system, a hand-held computerized terminal with rechargeable batteries therein may be bodily inserted into a charger receptacle. The terminal may have volatile memory and other components requiring load current during charging., The system may automatically identify battery type and progressively increase charging current while monitoring for an increase in battery terminal voltage to ascertain the level of load current. The battery temperature may be brought into a relationship to surrounding temperature such that by applying a suitable overcharge current value and observing any resultant temperature increase, the level of remaining battery charge can be determined. For example, if the battery is found to be relatively fully discharged, a relatively high fast-charge rate may be safely applied while monitoring battery temperature. If the battery is initially relatively fully charged or reaches such a state during fast charge, the system may automatically dynamically select a maintenance charge rate according to battery type and temperature. A preferred system may automatically recharge the batteries of a portable device according to an optimum schedule of essentially maximum safe charging rates as a function of battery temperature, and thereafter safely maintain the batteries at essentially fully charged condition in readiness for maximum duration portable operation.

59 Claims, 31 Drawing Sheets

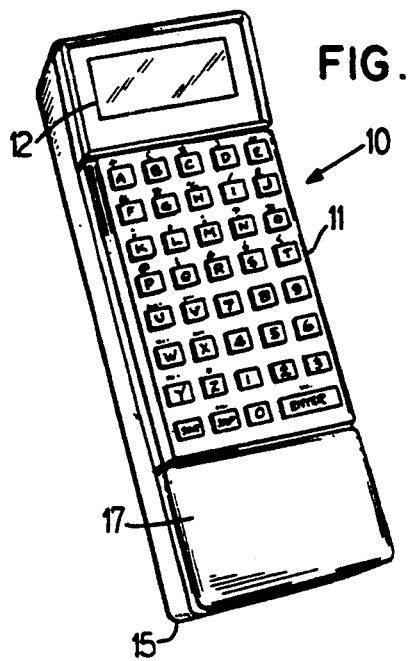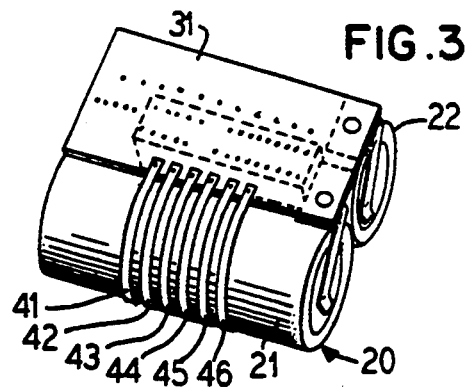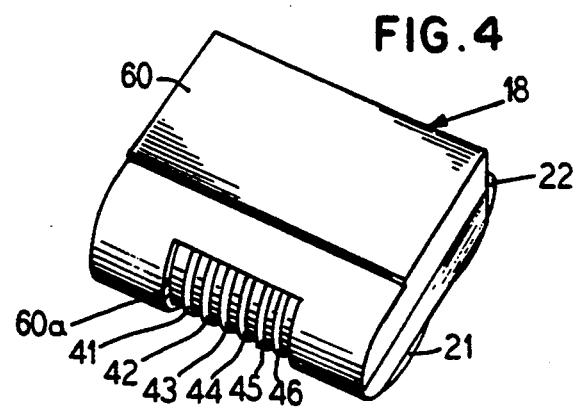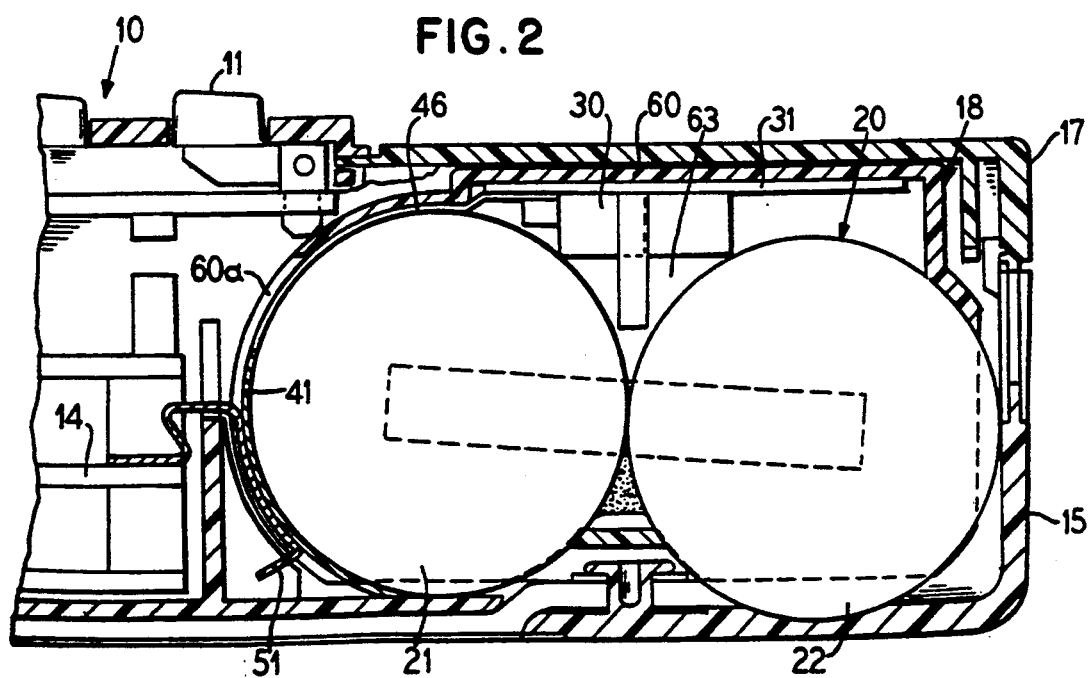

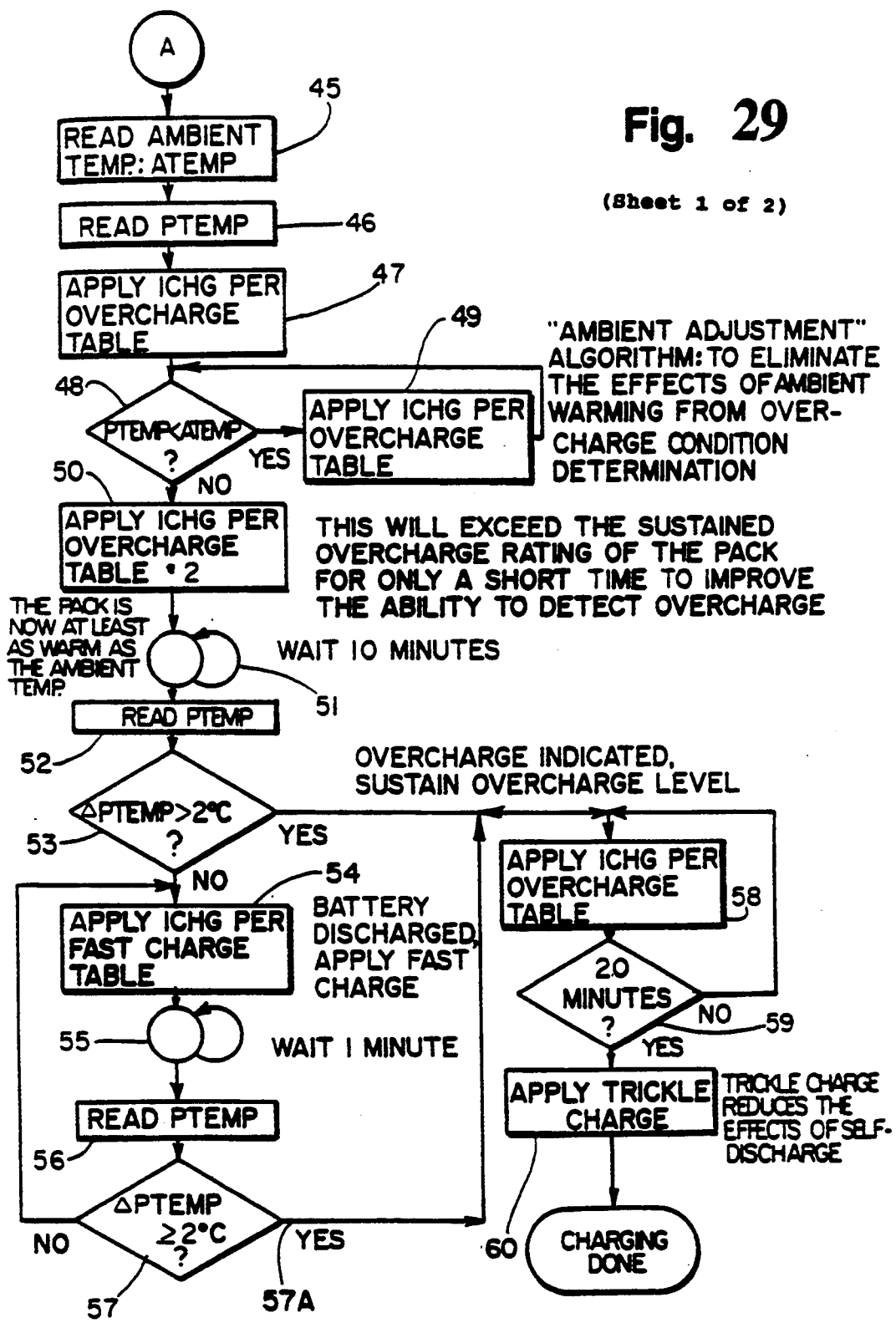
Fig. 29 (Sheet 1 of 2)

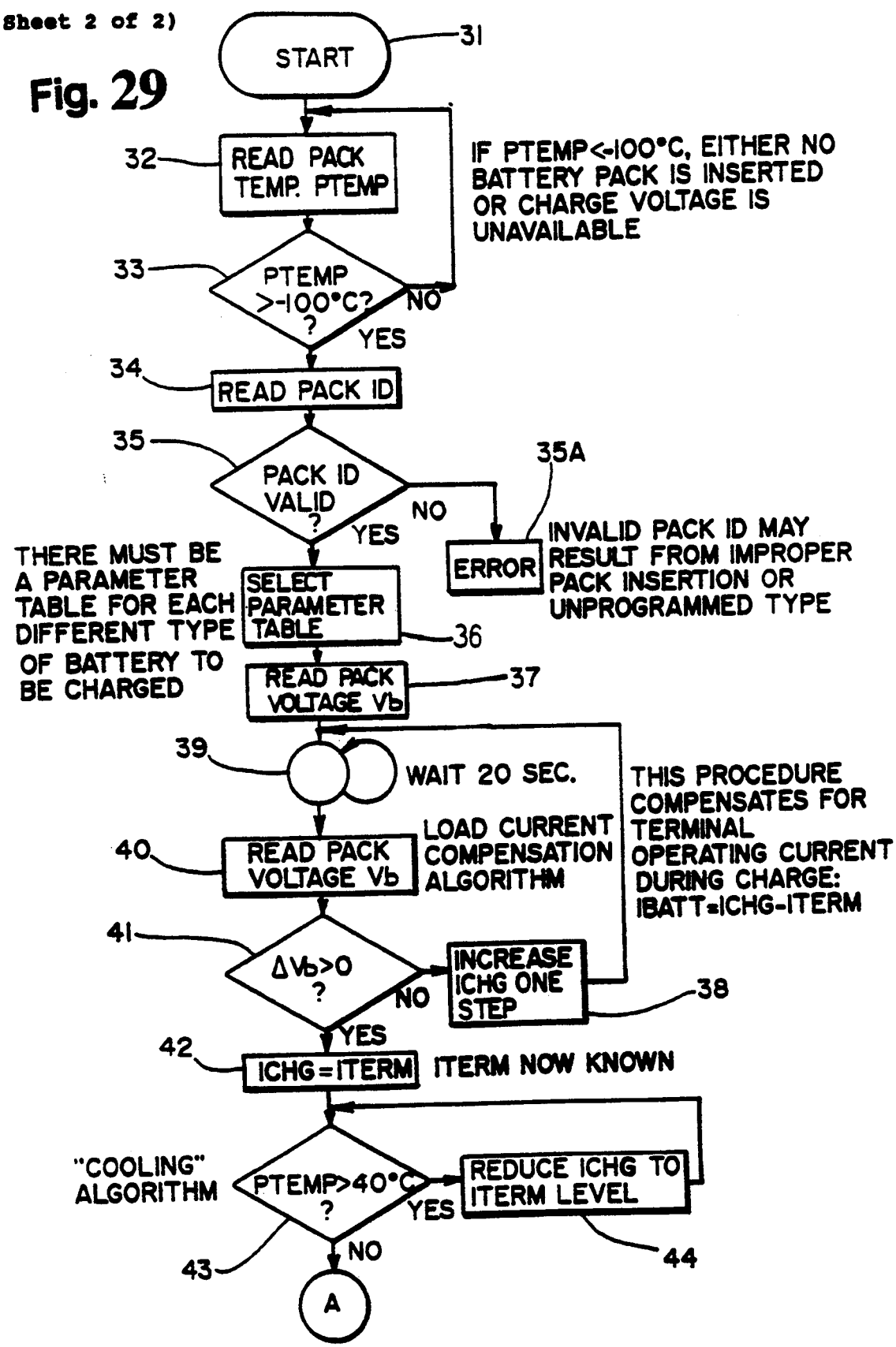

NOTE: R1 SELECTED FOR SHUNT VOLTAGE LEVEL (Sheet 1 of 2)

FAST CHARGE CELLS: MAXIMUM PERMISSIBLE OVERCHARGE RATE

FAST CHARGE CELLS: MAXIMUM CHARGE RATE

FAST BATTERY CHARGER

CROSS-REFERENCE TO RELATED APPLICATIONS

This application is a continuation in part of applications U.S. Ser. No. 07/446,231 filed Dec. 5, 1989 now abandoned, and U.S. Ser. No. 07/478,180 filed Feb. 9, 1990, now abandoned.

Said pending applications refer under 35 USC 120 to earlier application U.S. Ser. No. 07/266,537 filed Nov. 2, 1988, now abandoned, and also to applications U.S. Ser. No. 07/422,226 filed Oct. 16, 1989 (Now U.S. Pat. No. 4,961,043 issued Oct. 2, 1990) and Ser. No. 07/168,352 filed Mar. 15, 1988 (now U.S. Pat. No. 4,885,523, issued Dec. 5, 1989). Said pending applications refer under 35 USC 120 to earlier applications Ser. No. 06/944,503 filed Dec. 18, 1986 (now U.S. Pat. No. 4,737,702 issued Apr. 12, 1988). Said earlier applications Ser. No. 06/944,503 and Ser. No. 07/168,352 in turn refer under 35 USC 120 to earlier applications U.S. Ser. No. 876,194 filed Jun. 19, 1986 (now U.S. Pat. No. 4,709,202 issued Nov. 24, 1987), and U.S. Ser. No. 797,235 filed Nov. 12, 1985 (now U.S. Pat. No. 4,716,354 issued Dec. 29, 1987). Said applications Ser. No. 797,235 and Ser. No. 876,194 refer, pursuant to 35 USC 120 to earlier application Ser. No. 612,588 filed May 21, 1984 (now U.S. Pat. No. 4,553,081 issued Nov. 12, 1985), which is a continuation-in-part of earlier application Ser. No. 385,830 filed Jun. 7, 1982 (now U.S. Pat. No. 4,455,523 issued Jun. 19, 1984), and all of these earlier applications are also referred to herein in accordance with the provisions of 35 USC 120.

INCORPORATION BY REFERENCE

The disclosures and drawings of the above-mentioned U.S. Pat. Nos. 4,455,523; 4,553,081; 4,737,702; and 4,885,523; published PCT Application No. PCT/US90/07049, filed Dec. 3, 1990; and of the pending applications U.S. Ser. No. 07/266,537 and U.S. Ser. No. 07/837,650, filed Feb. 18, 1992 are hereby incorporated herein by reference in their entirety.

BACKGROUND OF THE INVENTION

NiCad (nickel-cadmium) battery technology has been employed successfully in portable hand-held applications for many years. Photographic equipment, power tools, data terminals, personal radio transceivers and pagers commonly utilize NiCad batteries as a power source. The charging systems that have been provided with these products have ranged from a simple transformer/rectifier type to rather complex systems to monitor and control the charging function. An increasing need is the ability to charge NiCad batteries quickly. To reliably and efficiently charge NiCad batteries at high rates requires careful control of the charging operation to avoid damage to the cells, particularly under extreme ambient temperature conditions.

The NiCad charge cycle consists of two basic parts: the coulombic portion and the overcharge portion. The coulombic portion of the charge cycle is characterized by the fact that most of the charge that is applied to the battery is stored in the form of electrochemical energy. This portion of the charge cycle is slightly endothermic, consequently high charge currents may be applied during this time without resulting in temperature increase. Most of the available battery capacity is stored during the coulombic portion of the charge cycle. The overcharge portion of the charge cycle is characterized by the fact that most of the applied charge current causes generation of oxygen gas at the positive electrode of the NiCad cell, with only a relatively small amount of charge actually being stored in the cell. The released oxygen chemically recombines with cadmium at the negative electrode of the cell which serves to equalize the internal pressure of the cell. If the overcharge rate is too high, the rate of oxygen recombination may be insufficient to prevent excessive internal pressure and cell venting, which drastically reduces the useful life of the cell.

The most critical factors in determining the maximum allowable charge current that may be safely applied to a NiCad battery are temperature and state of charge. At low temperatures the oxygen recombination rate is significantly reduced which limits the allowable overcharge current that may be applied without venting the cells if they are fully charged. At high temperatures the heat released by the oxygen recombination reaction may cause excessive cell temperature to be experienced leading to premature failure of the plate separator material and subsequent short-circuiting.

If the battery is fully discharged, minimal oxygen generation will occur until the battery nears the fully charged condition. If the battery is nearly fully charged, it will quickly enter the overcharge condition and begin oxygen generation. The difficulty lies in accurate determination of the previous state of charge to avoid damage to the battery.

As portable hand-held data and radio terminals continue to be used more widely in certain demanding applications, the need for fast charging of the terminal batteries becomes more significant. The increased use of high powered scanner attachments and peripherals as well as other connected devices often causes the terminal battery capacity to be taxed to the point where only a portion of the intended period of usage may be served with the stored charge available from a single battery pack. consequently, it has become increasingly necessary to provide multiple packs which may be exchanged in such a way that a depleted pack may be replaced by a fresh one with minimal downtime. When a depleted pack is removed, it should be fully recharged in, at most, the amount of time that a fresh pack is able to operate the terminal. With a recharging capability of this type, it is then possible for virtually perpetual operation to be provided with as few as two battery packs per terminal.

A similar but further complicated application involves the utilization of the described data terminals on a vehicle such as an industrial forklift truck. In this type of application, the terminal may receive power for operation from the vehicle the majority of the time. Often, however, it may be necessary for the terminal to be physically removed from the vehicle and operated in a fully portable mode for potentially extended periods of time. For this reason, it is highly advantageous to maintain the terminal batteries substantially at their fully charged or "topped off" state while they remain on board the vehicle.

SUMMARY OF THE INVENTION

A basic objective of the present invention is to provide a monitoring and control system which provides for effective fast charging. In order to avoid damage to the battery, the system automatically tests to determine the initial state of charge and selects the charging rate accordingly.

In a preferred implementation, a microprocessor receives measures of battery temperature and battery terminal voltage and selects an optimum charging rate. A unique feature of the preferred system is its ability to provide a safe controlled charge to a NiCad battery or to a battery of a similar type without sensing the current flow through the battery directly. This allows the effective battery impedance to be held at a minimum, thereby delivering the maximum available battery energy to the load.

Further features of the preferred system relate to the automatic processing of batteries subject to temperature extremes beyond the range where rapid charging operation is permitted.

Further objects relate to the provision of an improved battery conditioning system and method wherein batteries are safely maintained at optimum charge automatically, while accommodating repeated removal of the batteries from the charging system for varying periods of portable use, and providing automatic quick and efficient recharging after use at a wide range of temperatures.

In accordance with a feature of the improved battery conditioning system, the differential between ambient temperature and battery temperature is used to select between fast charge mode, and a battery conditioning mode wherein the battery temperature is adjusted relative to ambient temperature. Preferably during such adjustment a moderate current is applied not exceeding a safe overcharge value but generally sufficient to compensate for any battery load. Such value of maintenance current may be selected according to self-identification by the battery pack or may be dynamically adjusted according to battery load current and minimum safe overcharge current for the battery temperature.

According to another feature of the improved battery conditioning system, a measure of battery voltage is obtained, e.g. after use of the above feature to equalize battery temperature and ambient temperature. A moderate current is then applied not exceeding any minimum safe overcharge value and any needed load current, and the current value is then dynamically adjusted so that battery voltage is maintained generally equal to the measured value, e.g. until battery temperature is in a range suited to fast charge operation.

The invention will now be described, by way of example and not by way of limitation, with reference to the accompanying sheets of drawings; and other objects, features and advantages of the invention will be apparent from this detailed disclosure and from the appended claims.

BRIEF DESCRIPTION OF THE DRAWINGS

FIGS. 1-8, 9A, 9B, 10-15, 16A, 16B and 17 and the brief description thereof are incorporated herein by reference to U.S. Ser. No. 876,194, now U.S. Pat. No. 4,709,202 issued Nov. 24, 1987.

FIG. 29A and 29B (sheets one and two) shows a flow chart for illustrating a preferred fast charging algorithm for use with the microprocessor of FIG. 28;

FIG. 36 also shows successive approximate slope values by means of straight lines covering successive equal time intervals of 600 seconds;

DETAILED DESCRIPTION

The detailed description of FIGS. 1 through 27 is incorporated herein by reference to the specification at col. 4, line 25, through col. 66, line 4, of the incorporated U.S. Pat. No. 4,709,202, by reference to the specification at col. 4, line 15, through col. 11, line 37 of the incorporated U.S. Pat. No. 4,737,702, and by reference to the specification of incorporated U.S. Pat. No. 4,885,523.

DESCRIPTION OF FIGS. 28-32

Figure 28:
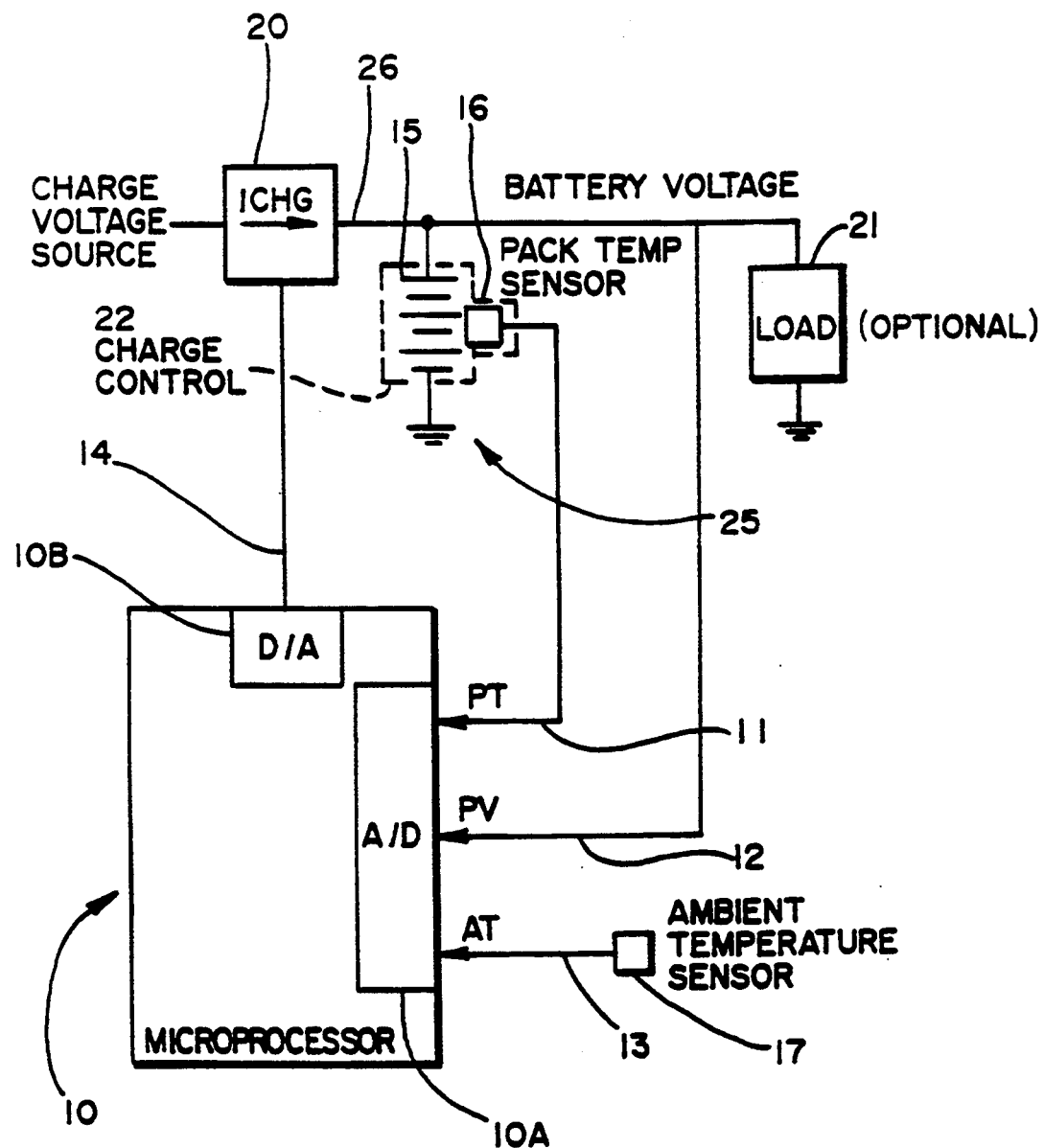
FIG. 28 is a block diagram illustration of a preferred fast charging in accordance with the present disclosure.

A block diagram of the charging system is shown in FIG. 28. A microprocessor 28-10 is preferably of a type that has analog to digital inputs such as 28-11 to 28-13 and digital to analog outputs such as 28-14 for interface to sensor and control functions. Both the temperature of battery 28-15 and ambient temperature are sensed as indicated at 28-16 and 28-17 so that absolute and relative temperature measurements may be made. The terminal voltage of the battery pack is sensed as indicated at 28-12 so that charge trends may be determined. The charge regulator comprised of a voltage controlled current source 28-20 whose output current (Ichg) is controlled by the level of the charge control signal at 28-14 from the microprocessor. A load 28-21 may or may not be connected during charge.

In the microprocessor 28-10, analog to digital (A/D) means and digital to analog (D/A) means are indicated at 28-10A and 28-10B. Preferably these means are integrated with the other components of the microprocessor as part of a monolithic unit or "chip" formed from a unitary substrate of semiconductor material.

With a charging system as shown in FIG. 28, flow diagram has been developed for fast charging of NiCad batteries as shown in FIG. 29 (sheets one and two). The charging function is initiated as represented by "start" at 29-1 e.g. by placing the battery 28-15 in the charger.

The temperature sensor 28-16 is preferably in a housing 28-22 which together with battery 28-15 forms the battery pack 28-25. The sensor 28-16 is preferably of the type whose output is proportional to absolute temperature e.g. at the rate of ten millivolts per degree Kelvin (10 mv/°K). The microprocessor 28-10 tests for insertion of the battery in the charger by reading the temperature PT(Ptemp as indicated at 29-2) and checking to determine if Ptemp shows a temperature greater than −100° C.; see decision block 29-3. The decision at block 29-3 will be affirmative only if a battery pack has been inserted to provide a non-zero voltage on the Ptemp signal line 28-11.

Figure 30:
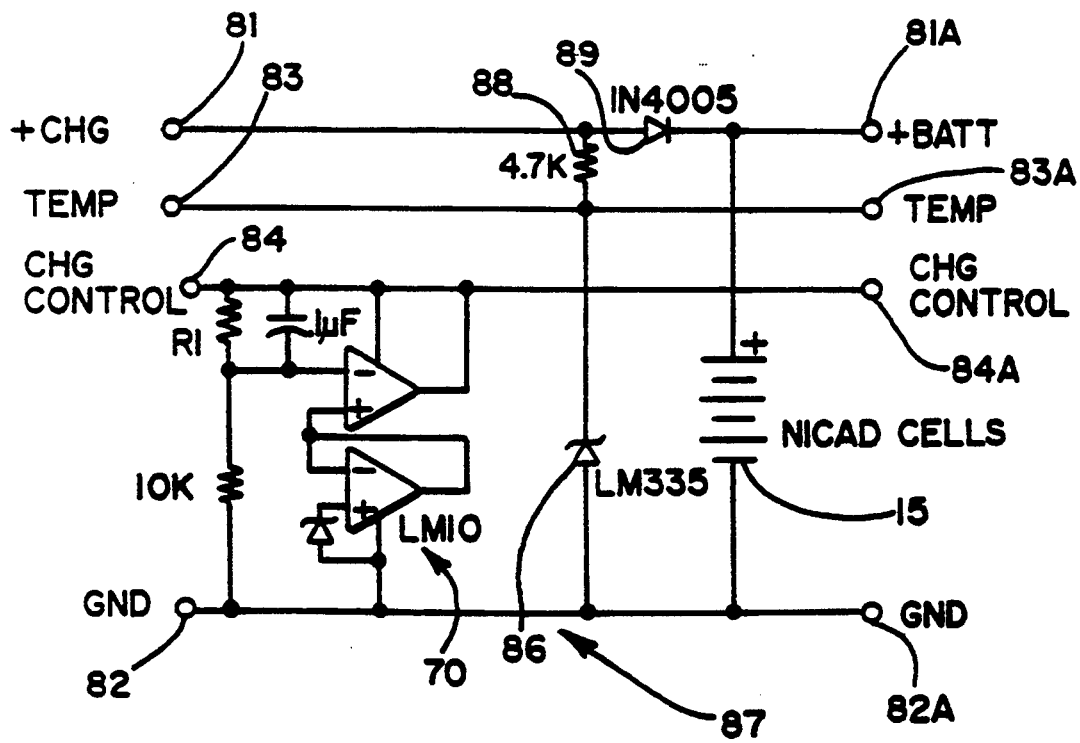
FIG. 30 is a circuit diagram illustrating a preferred arrangement for the automatic identification of various types of batteries which may be associated with a fast charging system accordingto FIGS. 28 and 29.

Following determination of the presence of a battery pack 28-25 in the charger, the pack type must be identified as represented at 29-4 and 29-5 to allow for cells with different charge characteristics. In the case of an invalid reading of battery pack identity, the program may branch to an error sub-routine as indicated at 29-5A. The identification of the type of battery inserted into the charger is a significant step in the battery processing operation since battery cells of specialized types may offer significantly higher capacity than ordinary NiCad cells, but they may require charging at lower maximum rates. Other cells may allow high charging rates at extreme temperatures. Future technology developments may offer new cell types with unusual charging parameters that may be accommodated by applying an appropriate charging algorithm. Referring to FIG. 30, a proposed method for identification of the pack type is to connect a shunt voltage regulator 30-10 to the battery pack 30-27 represented in FIG. 30. The shunt regulator may be comprised of a simple zener diode or it may be implemented with an active regulator e.g. as indicated in FIG. 30, depending on the number of different pack types that must be identified. Upon determination of the pack type a suitable one of a set of parameter tables may be selected that contains the appropriate values for charging the specified cell type, as shown at 29-6.

Figure 31:
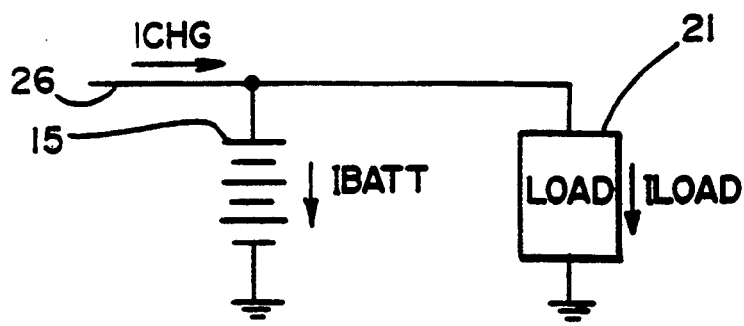
FIG. 31 is a diagram useful in explaining certain steps of the flow chart of FIG. 29.

As indicated in FIG. 28, there may be a load 28-21 placed on the battery that requires current. Consequently, current supplied by a charger is shared by the load and the battery as shown in FIG. 31. If the load current Iload is larger than the charge current Ichg, the battery will provide the difference, resulting in further discharge of the battery rather than charging. To compensate for this effect, the control system senses the terminal voltage (Vb) of the battery (step 29-7, FIG. 29) voltage PV, FIG. 1, and applies increasing charge current to the battery in small increments (step 29-8) until the terminal voltage trend is positive (steps 29-9 to 29-11) meaning the battery is accepting charge rather than providing current to a load (see block 29-12).

While the absolute terminal voltage of a NiCad battery is a poor indicator of its condition, its trend is a good indicator of charging versus discharging if it is measured over a short enough time that the pack temperature remains relatively constant. Once the battery voltage trend is determined to be positive, the level of current required by the load (Item of block 29-12 corresponding to Iload, FIG. 31) is known, and may be added to the desired net battery current level (Ibatt, FIG. 31) to select the actual charge current (Ichg, FIG. 31).

Typical NiCad cell specifications call for charging in a temperature range of 0° to 40° C. Many of the products that utilize NiCad batteries may operate in environments with temperatures that range from −30° C. to 60° C. Consequently, it is possible that a battery pack may be placed in a charger immediately after being removed from either of these temperature extremes. If the pack temperature is greater than 40° C., (see decision step 29-13), the pack must be "cooled" to no more than 40° C. before charging may proceed. This is accomplished (as shown by step 29-14) by applying a charge current Ichg that equals the terminal load Iterm so that no net charge current is received by the battery and it may be cooled by the ambient environment. If the battery pack is cold, it must be warmed to a temperature above 0° C. This is carried out by steps 29-15 to 29-19. By applying a safe (low) charge current per the charge table of steps 29-17 and 29-19 (and FIG. 33), the pack my be warmed by the ambient environment of the charger.

Figure 35:
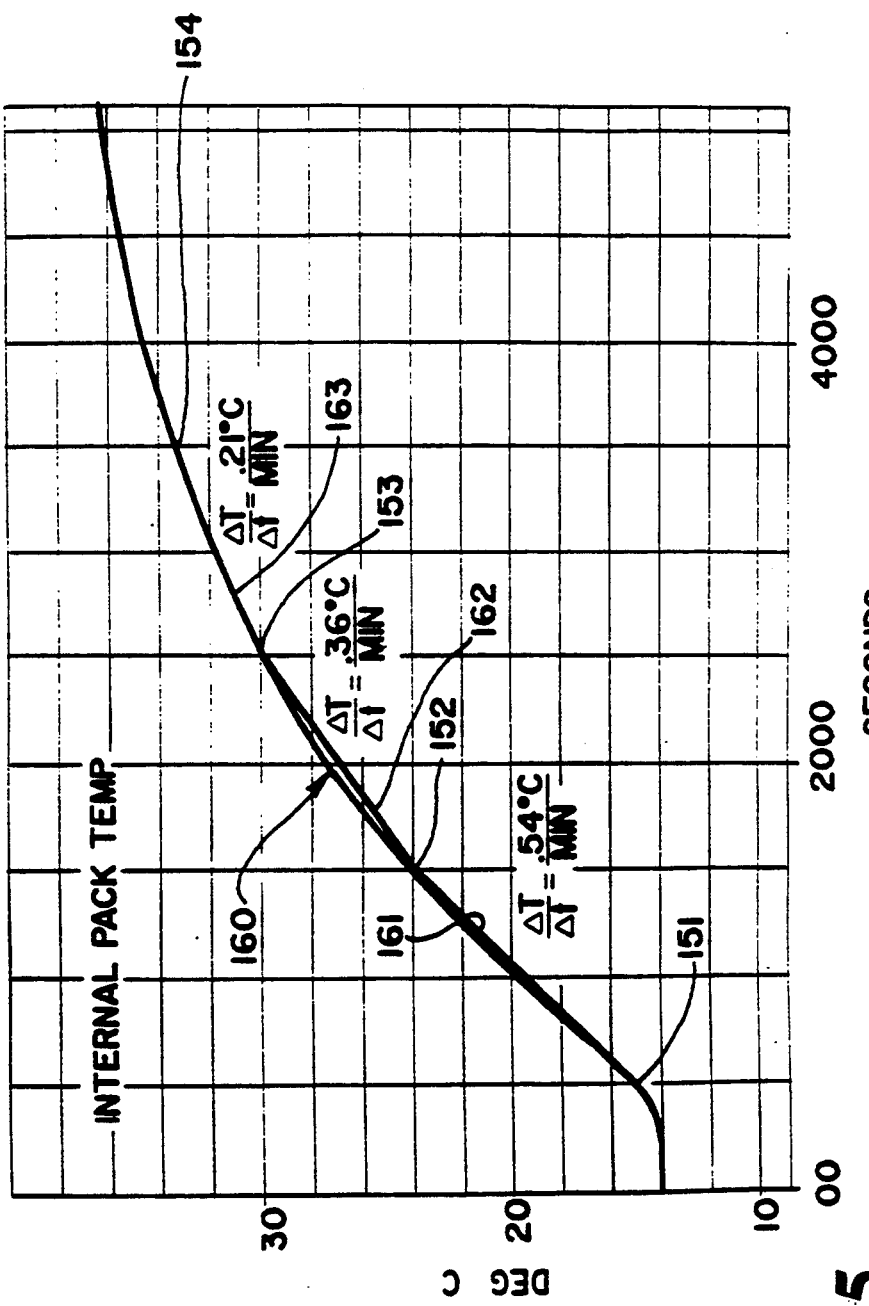
FIG. 35 shows a plot of measured battery pack temperature as a function of time for a previously fully charged enclosed battery pack where an overcharge current (Ichg) of three hundred milliamperes is applied and the ambient temperature $T_A$ is about fourteen degrees celsius (14° C.) and also illustrates successive approximate slope values for selected successive time intervals.

Although charging may begin when the battery temperature exceeds 0° C. according to the battery charging specifications, additional information is needed to determine the state of charge of the battery. The clearest method to determine whether a battery is fully charged is to detect the presence of the overcharge condition. In overcharge, the oxygen recombination reaction is highly exothermic which results in rapid heating of the battery. By applying twice the permissible substained overcharge rate as at steps 29-20 to 29-23 and monitoring cell temperature, it is possible to reliably determine that the overcharge condition has been reached. Unfortunately, when a cold pack is placed in a warm environment, there is a resultant temperature rise due to ambient warming that can actually occur at a rate faster than the heating due to the supply of a high value of overcharge current. Consequently, a reliable means of detecting heating due to overcharge current is first insure that the battery temperature is not substantially less than the ambient temperature (as determined by step 29-18). Once the battery is warmed to ambient temperature, the overcharge condition can be quickly detected by means of steps 29-20 to 29-23 since any further substantial increase in temperature can be attributed to internal heat being evolved by the battery. If the pack has been in a hot environment, the cooling (steps 29-13 and 29-14) will bring its temperature down to no more than 40° C., which is above the ambient temperature of the charger. Overcharge induced heating will cause the pack temperature to begin to increase again as shown by FIG. 35. According to the described control method, the charge current applied to the battery for overcharge detection (step 29-20) is double the standard overcharge table value of steps 29-17, 29-19 and 29-28 (and of FIG. 33) to improve the ability to detect a temperature increase. Since the test time is relatively short, little gas pressure increase and potential for cell venting is involved.

Once it has been determined that the battery is not in the overcharge condition (at decision block 29-23), it is a relatively simple matter to apply the appropriate charge value from the fast charge parameter table (as at step 29-24, FIG. 29). The fast charge table value may correspond to that indicated in FIG. 34 and is a function of temperature so that a temperature regulation capability is implemented for reducing the current applied at elevated temperatures. During the fast charge operation, battery temperature increase is closely monitored (steps 29-25 to 29-27) to determine when overcharge has been reached, so that the fast charge cycle may be terminated (as represented by branch line 29-27a) and a controlled temperature overcharge cycle may be initiated as represented by step 29-28 and FIG. 33 to "top-off" the battery for maximum capacity. After the overcharge cycle is complete (after step 29-29), a trickle charge current is applied per step 29-30 to maintain the full battery capacity and offset the effects of self-discharge normally seen when a battery rests in an idle condition.

Figure 32:
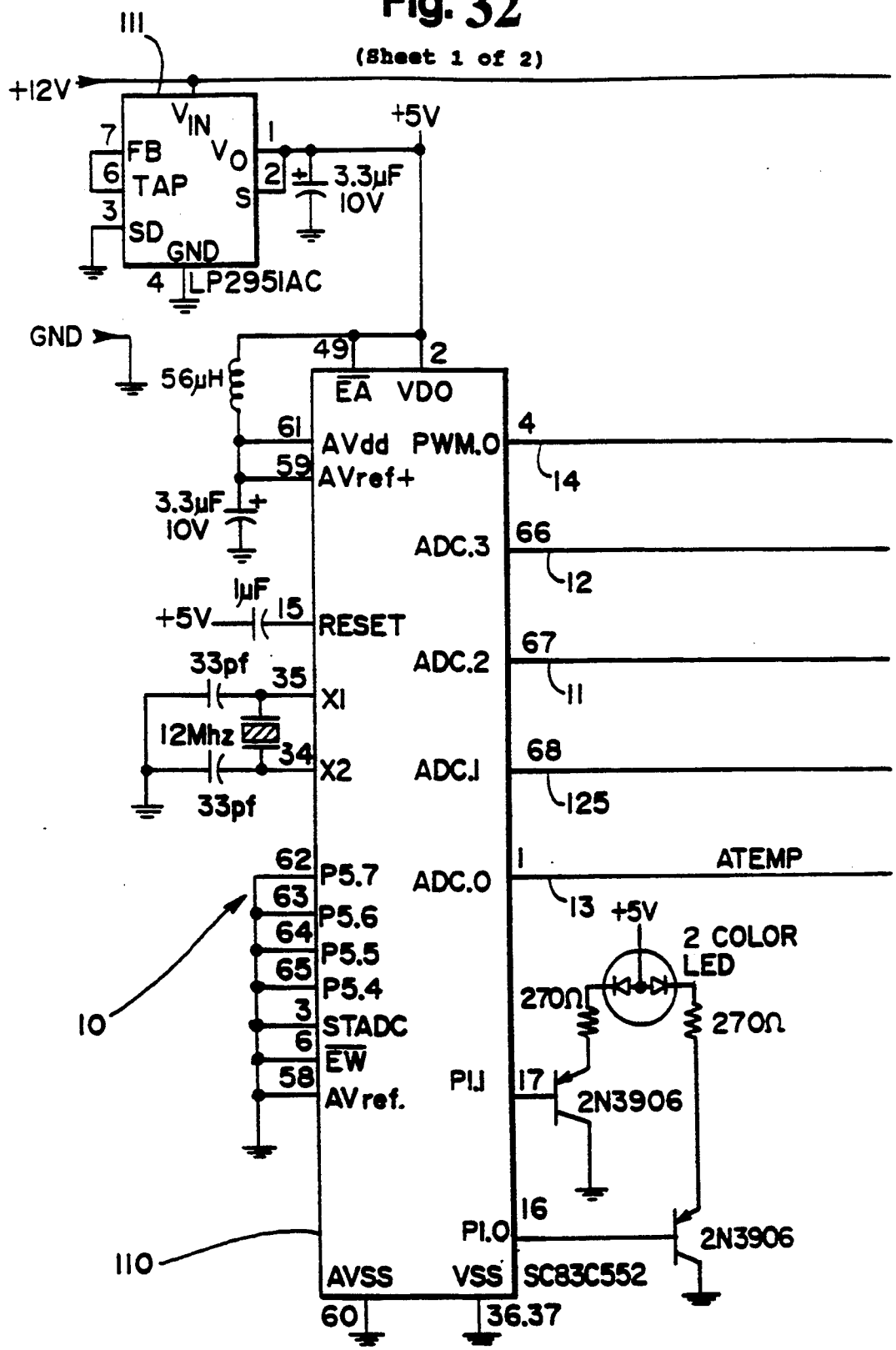
FIG. 32 is a circuit diagram for illustrating an exemplary implementation of the block diagram of FIG. 28.
Figure 32:
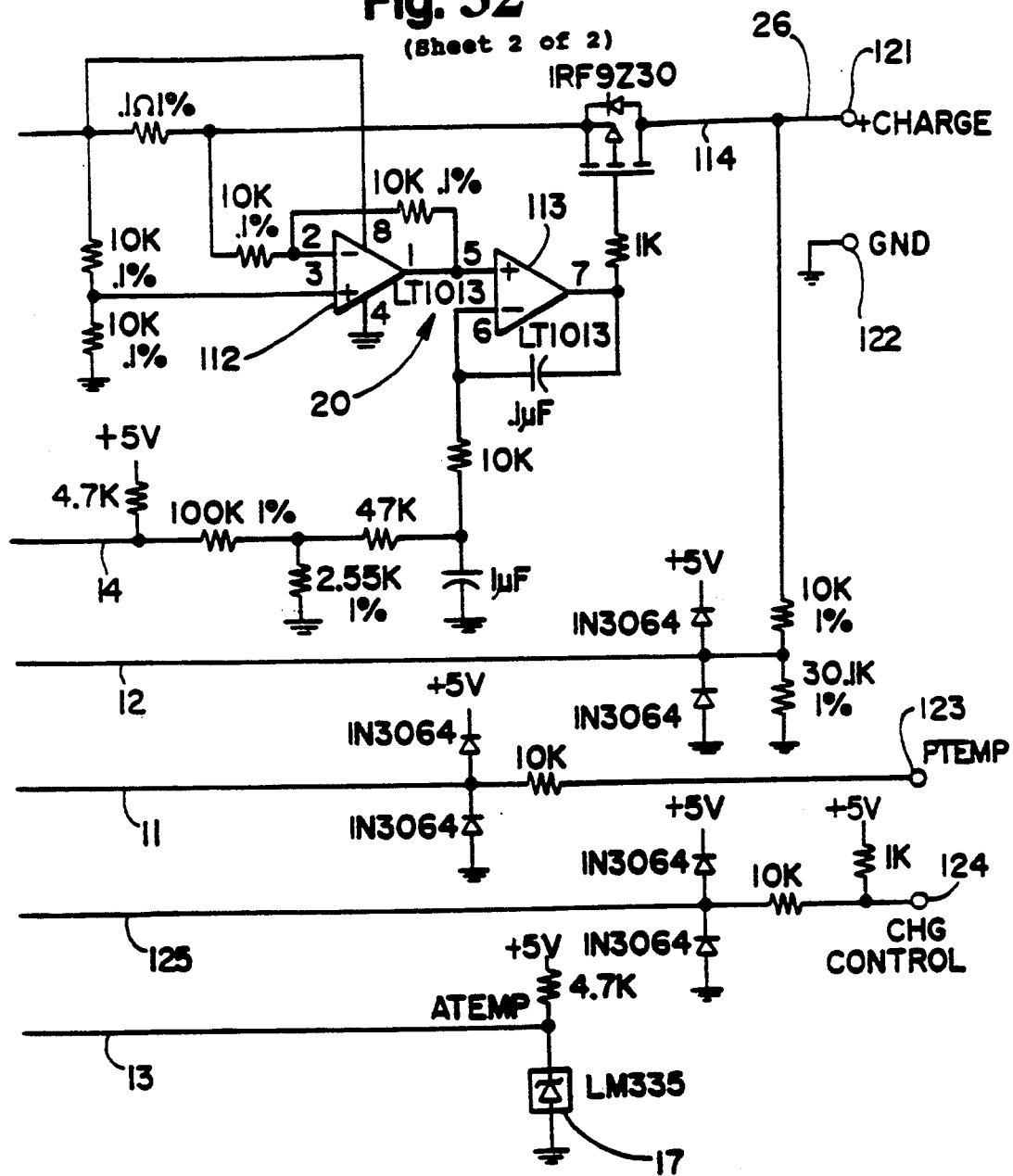

FIG. 32 shows an exemplary embodiment of the described fast charging system utilizing a microprocessor system with a programmed control system for fast charging of battery packs. Other embodiments involving control circuits contained within a data terminal or other utilization device may employ identical control methods without departing from the concepts described.

FIG. 32 represents an implementation of FIG. 28, and corresponding reference numerals have been applied in FIG. 32 so as to facilitate correlation therewith. The major components of FIG. 32 may comprise commercially available parts which are identified as follows:

microprocessor chip 32-10 of microprocessor system 28-10, type SC83C552 voltage regulator 32-11, type LP2951AC amplifiers 28-12 and 28-13 of charge regulator 28-20, type LT1013 transistor 32, type 1RF9Z30 temperature sensor 28-17, type LM335

The programming for microprocessor element 32-10 of FIG. 32 may correspond with that represented in FIGS. 29, 33 and 34, as described with reference to these figures and the circuits of FIGS. 28, 30 and 31. By way of example, terminals 32-21, 32-22, 32-23 and 32-24, FIG. 32, may be connected with terminals 30-21, 30-22, 30-23 and 30-24 respectively in FIG. 30. Temperature sensor 30-26, FIG. 30, which is connected between terminals 30-22 and 30-23, may correspond with sensor 28-16 and may be mounted in intimate heat transfer relation with battery 28-15 and within the housing of the battery pack 28-25 as represented in FIG. 28. Resistor R1, FIG. 30, has a respective one of a set of values so as to provide a voltage level between terminals 30-22 and 30-24 selected so as to identify the particular type of battery pack 30-27 with which it is associated.

Terminals 30-21A, 30-22A, 30-23A and 30-24A may be connected with a utilization circuit to supply energy thereto during portable operation. It will be noted that the battery pack 30-27 can be associated with the circuitry of the 16 Figure (16A and 16B) of incorporated U.S. Pat. No. 4,709,202, terminals 30-21A and 30-22A having a quick-release connection with terminals JP-1, JP-2, FIG. 16B, and terminals 30-23A having a quick-release coupling with terminal J7-3, FIG. 16B. Terminal 30-24A can be used by the portable device to identify the battery pack, where the portable device provides a circuit such as associated with terminal 32-24, FIG. 32, leading to an analog to digital input such as 32-25, FIG. 32.

FIG. 35 illustrates by a plot 35-10 the increase in temperature as a function of time of an enclosed battery pack such as 27-10B, FIG. 27, 28-25, FIG. 28 or 30-27, FIG. 30, due to an overcharge current of 300 milliamperes, where the battery means 27-27, 28-15 is initially fully charged and is at a battery temperature of about minus eight degrees celsius, the ambient temperature being about fourteen degrees celsius. The slopes between successive points 35-1, 35-2, 35-3 and 35-4, are represented by straight line segments 35-11, 35-12 and 35-13 with respective slope values of 0.54 degrees celsius per minute, 0.36 degrees celsius per minute and 0.21 degrees celsius per minute.

Figure 36:
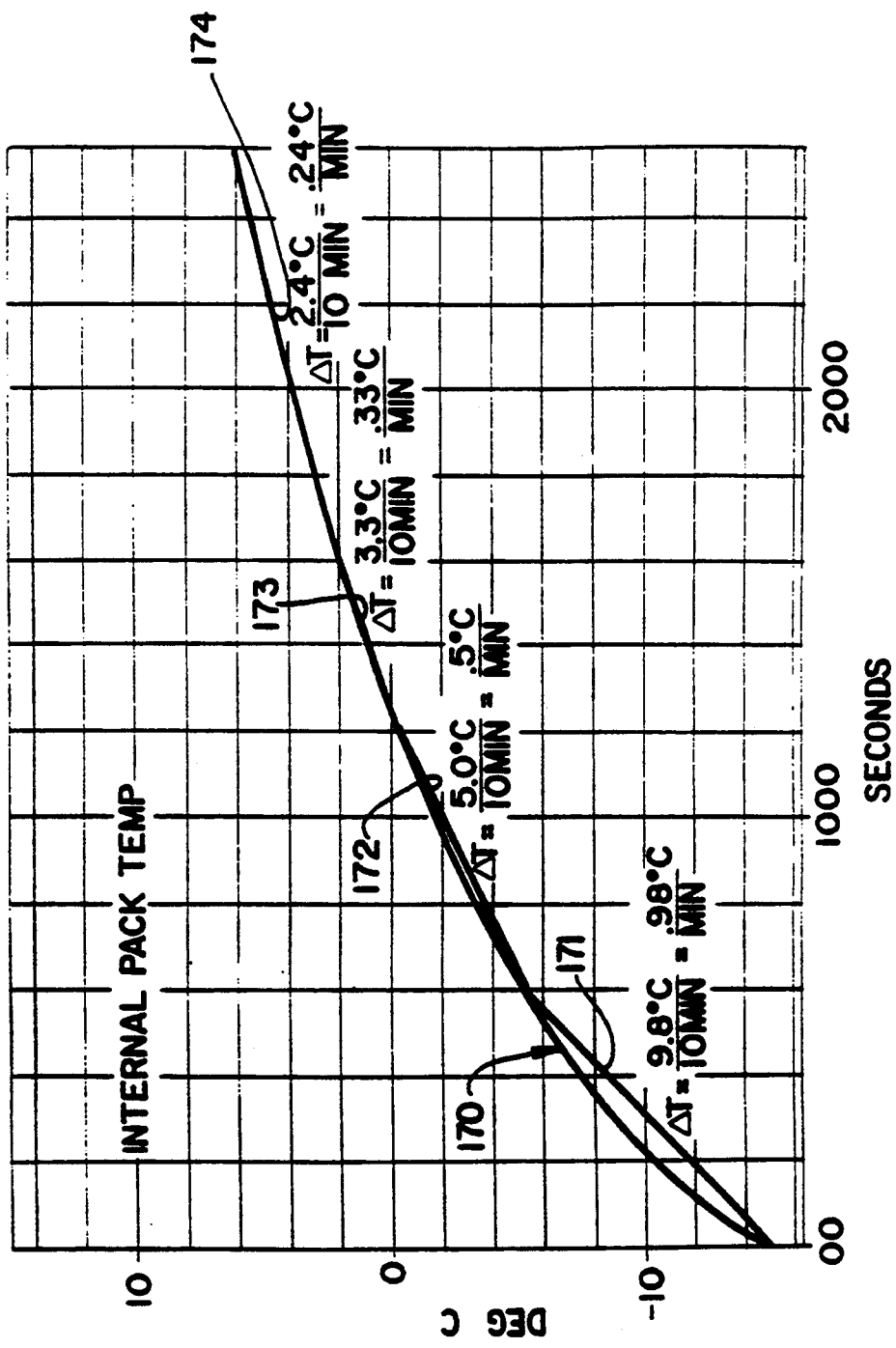
FIG. 36 is a plot of measured battery pack temperature as a function of time for the case of an enclosed battery pack which is initially at a much lower temperature than ambient temperature; specifically the battery pack was initially at a temperature of about minus fifteen degrees celsius (−15° C.) while the ambient temperature was about twenty degrees celsius (20°), the battery pack receiving only a small charging current of six milliamperes.

FIG. 36 for the sake of comparison shows by a curve 36-10 the rate of warming of such a battery pack due to an ambient temperature which is substantially higher than battery temperature. Specifically FIG. 36 shows the case where initial battery temperature is about minus fifteen degrees celsius and ambient temperature is about twenty degrees celsius. Straight line segments 36-11, 36-12, 36-13, 36-14 show approximate slope values of 0.98 degrees celsius per minute, 0.5 degrees celsius per minute, 0.33 degrees celsius per minute and 0.24 degrees celsius per minute. The relatively high slope values indicate that the differential between a high ambient temperature and a low battery temperature must be taken into account when using steps 29-20 to 29-23 to determine whether a battery is in the overcharge range.

DISCUSSION OF FIGS. 33 THROUGH 36 AND TABLES I AND II

Figure 33:
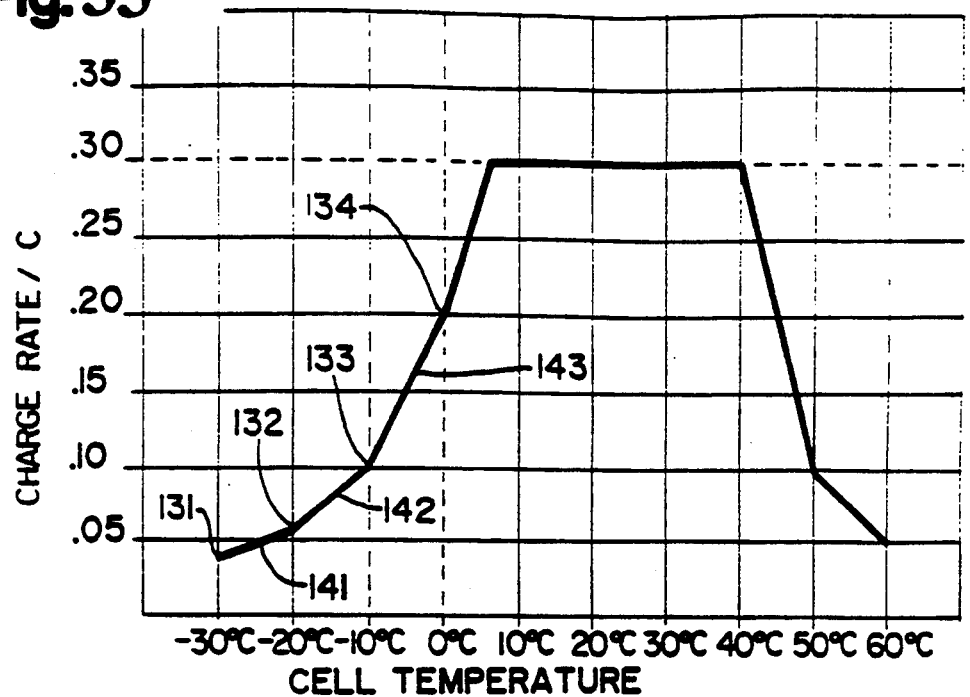
FIG. 33 illustrates a plot showing a maximum permissible overcharge rate for fast charge cells as a function of cell temperature, and provides information which may be incorporated in the programming of the system of FIGS. 28-32 for establishing an optimum value of charging current (Ichg) during sustained overcharging.
Figure 34:
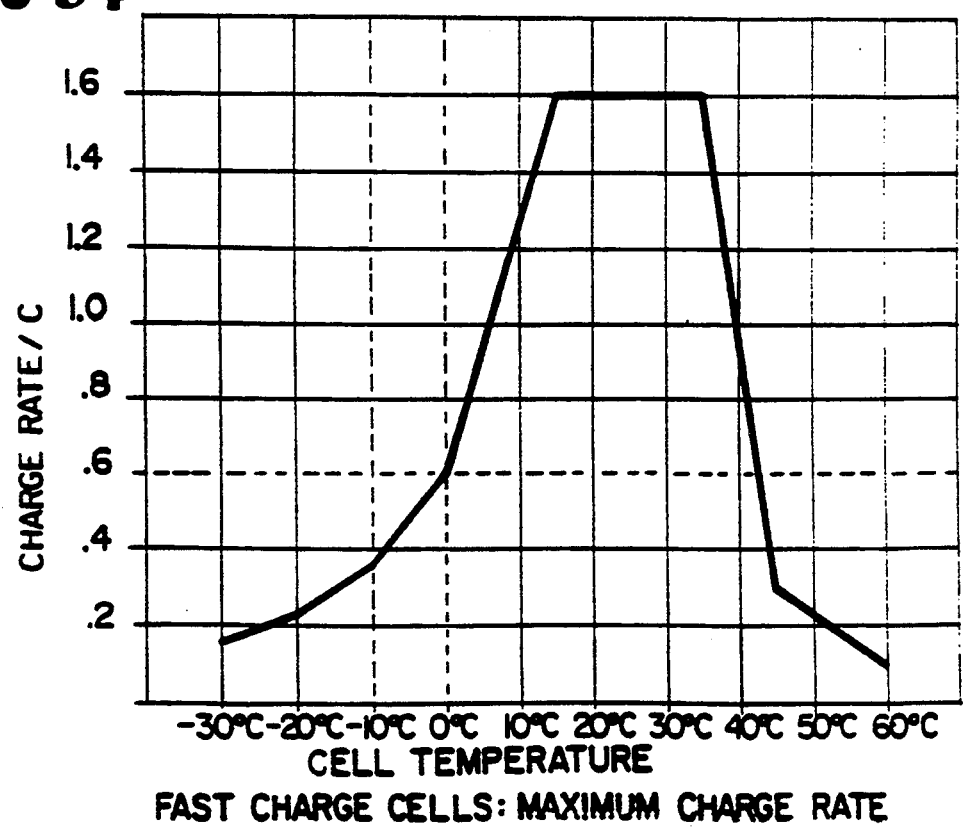
FIG. 34 illustrates a plot of maximum charge rate for fast charge cells as a function of cell temperature to show exemplary data which may be used for the system programming in FIGS. 28-32 for establishing an optimum value of charging current for a battery which has not yet reached the overcharge state.

FIGS. 33 and 34 represent in effect a series of tables of charge rate versus temperature since the ordinate values are in units of charge rate (e.g. current Ibatt in milliamperes divided by capacity C in milliampere-hours). The following TABLES I and II give values of overcharge and fast charge corresponding to FIGS. 33 and 34 for successive temperatures in increments of two degrees celsius, and give corresponding current values in milliamperes for two different values of battery capacity C, namely C equals 800 milliampere-hours and C equals 1200 milliampere hours.

TABLE I

Charge Table: Overcharge and Fast Charge
Battery type: 800 ma-hr fast charge

| Temp, °C. | Overcharge value | | Fast Charge value | |
|---|---|---|---|---|
| | C. units | ma. | C. units | ma. |
| −30 | 0.040 | 32 | 0.160 | 128 |
| −28 | 0.044 | 35 | 0.176 | 141 |
| −26 | 0.048 | 38 | 0.192 | 154 |
| −24 | 0.052 | 42 | 0.208 | 166 |
| −22 | 0.056 | 45 | 0.224 | 179 |
| −20 | 0.060 | 48 | 0.240 | 192 |
| −18 | 0.068 | 54 | 0.264 | 211 |
| −16 | 0.076 | 61 | 0.288 | 230 |
| −14 | 0.084 | 67 | 0.312 | 250 |
| −12 | 0.092 | 74 | 0.336 | 269 |
| −10 | 0.100 | 80 | 0.360 | 288 |
| −8 | 0.120 | 96 | 0.408 | 326 |
| −6 | 0.140 | 112 | 0.456 | 365 |
| −4 | 0.160 | 128 | 0.504 | 403 |
| −2 | 0.180 | 144 | 0.552 | 442 |
| 0 | 0.200 | 160 | 0.600 | 480 |
| 2 | 0.220 | 176 | 0.742 | 594 |
| 4 | 0.240 | 192 | 0.886 | 709 |
| 6 | 0.260 | 208 | 1.029 | 823 |
| 8 | 0.280 | 224 | 1.171 | 937 |
| 10 | 0.300 | 240 | 1.314 | 1051 |
| 12 | 0.300 | 240 | 1.457 | 1166 |
| 14 | 0.300 | 240 | 1.600 | 1280 |
| 16 | 0.300 | 240 | 1.600 | 1280 |
| 18 | 0.300 | 240 | 1.600 | 1280 |
| 20 | 0.300 | 240 | 1.600 | 1280 |
| 22 | 0.300 | 240 | 1.600 | 1280 |
| 24 | 0.300 | 240 | 1.600 | 1280 |
| 26 | 0.300 | 240 | 1.600 | 1280 |
| 28 | 0.300 | 240 | 1.600 | 1280 |
| 30 | 0.300 | 240 | 1.600 | 1280 |
| 32 | 0.300 | 240 | 1.600 | 1280 |
| 34 | 0.300 | 240 | 1.600 | 1280 |
| 36 | 0.300 | 240 | 1.340 | 1072 |
| 38 | 0.300 | 240 | 1.080 | 864 |
| 40 | 0.300 | 240 | 0.820 | 656 |
| 42 | 0.260 | 208 | 0.560 | 448 |
| 44 | 0.220 | 176 | 0.300 | 240 |

TABLE I-continued

Charge Table: Overcharge and Fast Charge
Battery type: 800 ma-hr fast charge

| Temp, °C. | Overcharge value | | Fast Charge value | |
|---|---|---|---|---|
| | C. units | ma. | C. units | ma. |
| 46 | 0.180 | 144 | 0.275 | 220 |
| 48 | 0.140 | 112 | 0.250 | 200 |
| 50 | 0.100 | 80 | 0.225 | 180 |
| 52 | 0.090 | 72 | 0.200 | 160 |
| 54 | 0.080 | 64 | 0.175 | 140 |
| 56 | 0.070 | 56 | 0.150 | 120 |
| 58 | 0.060 | 48 | 0.125 | 100 |
| 60 | 0.050 | 40 | 0.100 | 80 |

TABLE II

Charge Table: Overcharge and Fast Charge
Battery type: 1200 ma-hr fast charge

| Temp, °C. | Overcharge value | | Fast Charge value | |
|---|---|---|---|---|
| | C. units | ma. | C. units | ma. |
| −30 | 0.040 | 48 | 0.160 | 192 |
| −28 | 0.044 | 53 | 0.176 | 211 |
| −26 | 0.048 | 58 | 0.192 | 230 |
| −24 | 0.052 | 62 | 0.208 | 250 |
| −22 | 0.056 | 67 | 0.224 | 269 |
| −20 | 0.060 | 72 | 0.240 | 288 |
| −18 | 0.068 | 82 | 0.264 | 317 |
| −16 | 0.076 | 91 | 0.288 | 346 |
| −14 | 0.084 | 101 | 0.312 | 374 |
| −12 | 0.092 | 110 | 0.336 | 403 |
| −10 | 0.100 | 120 | 0.360 | 432 |
| −8 | 0.120 | 144 | 0.408 | 490 |
| −6 | 0.140 | 168 | 0.456 | 547 |
| −4 | 0.160 | 192 | 0.504 | 605 |
| −2 | 0.180 | 216 | 0.552 | 662 |
| 0 | 0.200 | 240 | 0.600 | 720 |
| 2 | 0.220 | 264 | 0.742 | 890 |
| 4 | 0.240 | 288 | 0.886 | 1063 |
| 6 | 0.260 | 312 | 1.029 | 1280 |
| 8 | 0.280 | 336 | 1.171 | 1280* |
| 10 | 0.300 | 360 | 1.314 | 1280* |
| 12 | 0.300 | 360 | 1.457 | 1280* |
| 14 | 0.300 | 360 | 1.600 | 1280* |
| 16 | 0.300 | 360 | 1.600 | 1280* |
| 18 | 0.300 | 360 | 1.600 | 1280* |
| 20 | 0.300 | 360 | 1.600 | 1280* |
| 22 | 0.300 | 360 | 1.600 | 1280* |
| 24 | 0.300 | 360 | 1.600 | 1280* |
| 26 | 0.300 | 360 | 1.600 | 1280* |
| 28 | 0.300 | 360 | 1.600 | 1280* |
| 30 | 0.300 | 360 | 1.600 | 1280* |
| 32 | 0.300 | 360 | 1.600 | 1280* |
| 34 | 0.300 | 360 | 1.600 | 1280* |
| 36 | 0.300 | 360 | 1.340 | 1280* |
| 38 | 0.300 | 360 | 1.080 | 1280* |
| 40 | 0.300 | 360 | 0.820 | 984 |
| 42 | 0.260 | 312 | 0.560 | 672 |
| 44 | 0.220 | 264 | 0.300 | 360 |
| 46 | 0.180 | 216 | 0.275 | 330 |
| 48 | 0.140 | 168 | 0.250 | 300 |
| 50 | 0.100 | 120 | 0.225 | 270 |
| 52 | 0.090 | 108 | 0.200 | 240 |
| 54 | 0.080 | 96 | 0.175 | 210 |
| 56 | 0.070 | 84 | 0.150 | 180 |
| 58 | 0.060 | 72 | 0.125 | 150 |
| 60 | 0.050 | 60 | 0.100 | 120 |

*note: maximum charge current available is 1280 ma.

TABLES I and II may be stored in machine readable form in the memory of microprocessor system 28-10 or 32-10, e.g. in first and second read only memory segments. Thus if step 29-4 identified an 800 milliampere-hour capacity fast charge nickel-cadmium battery means, the microprocessor would access the first memory segment corresponding to TABLE I for steps such as 29-17, 29-19, 29-20, 29-24 and 29-28, while if step 29-4 showed a 1200 milliampere-hour capacity fast charge nickel-cadmium battery means the second memory segment corresponding to TABLE II would be addressed.

If for example, the battery temperature (Ptemp) in step 29-16 were greater than nineteen degrees celsius but less than or equal to twenty-one degrees celsius, the overcharge value read from memory segment I would be 240 milliamperes (0.300 units in FIG. 33 times 800 milliampere-hours, the battery capacity C, equals 240 milliamperes). Thus according to step 29-17 and step 29-19, an overcharge current of 240 milliamperes (plus any needed load current) would be supplied by regulator 28-20 until temperature sensor 28-16 showed that battery temperature exceeded ambient temperature (Atemp, 28-13, FIG. 28).

If ambient temperature were thirty degrees celsius and the battery temperature were in the range from thirty-one to thirty-three degrees celsius, a current of 480 amperes would be applied according to step 29-20, but for a limited duration (e.g. about ten minutes per step 29-21) such as to avoid substantial detriment to the useful life of the battery means.

FIG. 36 illustrates warming of the battery pack as a function of time with the battery pack initially at a temperature of about minus fifteen degrees celsius. From FIG. 33, it can be seen that maximum permissible overcharge current corresponds to about 0.08 units. For a battery capacity of 800 milliampere hours, this would correspond to an overcharge current value of greater than sixty milliamperes, while FIG. 36 shows the warming rate with an ambient temperature of about twenty degrees celsius and a relatively negligible value of charging current (i.e. Ichg equals six milliamperes). It will be noted that the warming rate in FIG. 36 in the first 600 seconds is 0.98 degrees celsius per minute which considerably exceeds the warming rate produced by a current of 300 milliamperes in FIG. 35.

Supplementary Discussion of FIGS. 28-36

For representing an embodiment such as that of FIG. 30, a microprocessor system such as indicated at 28-10 in FIG. 28 would be shown with a fourth input to A/D means 28-10A corresponding with input 32-25, FIG. 32. For such an embodiment each type of battery means such as the one with 800 milliampere-hour capacity and temperature characteristics as shown in Table I, and the one with 1200 ampere-hour capacity and characteristics according to Table II would have a respective distinct value of R1, FIG. 30, and a respective different shunt voltage level so as to enable the microprocessor system 28-10 to reliably identify each of numerous types of battery means pursuant to step 29-4. The microprocessor system 28-10 or 32-10 may store a set of parameter tables such as Tables I and II in machine readable form with each table of such set having an address associated with the corresponding shunt voltage level. In this way the appropriate stored table can be interrogated by the microprocessor in accordance with a given battery temperature reading so as to obtain appropriate current values for steps 29-8, 29-17, 29-19, 29-20, 29-24 and 29-28.

The battery identification means 26-36 or 30-10 would distinguish the presence or absence of an internal current regulator 26-28 as well as identifying the various battery types requiring different charging and overcharge treatment.

Figure 5:
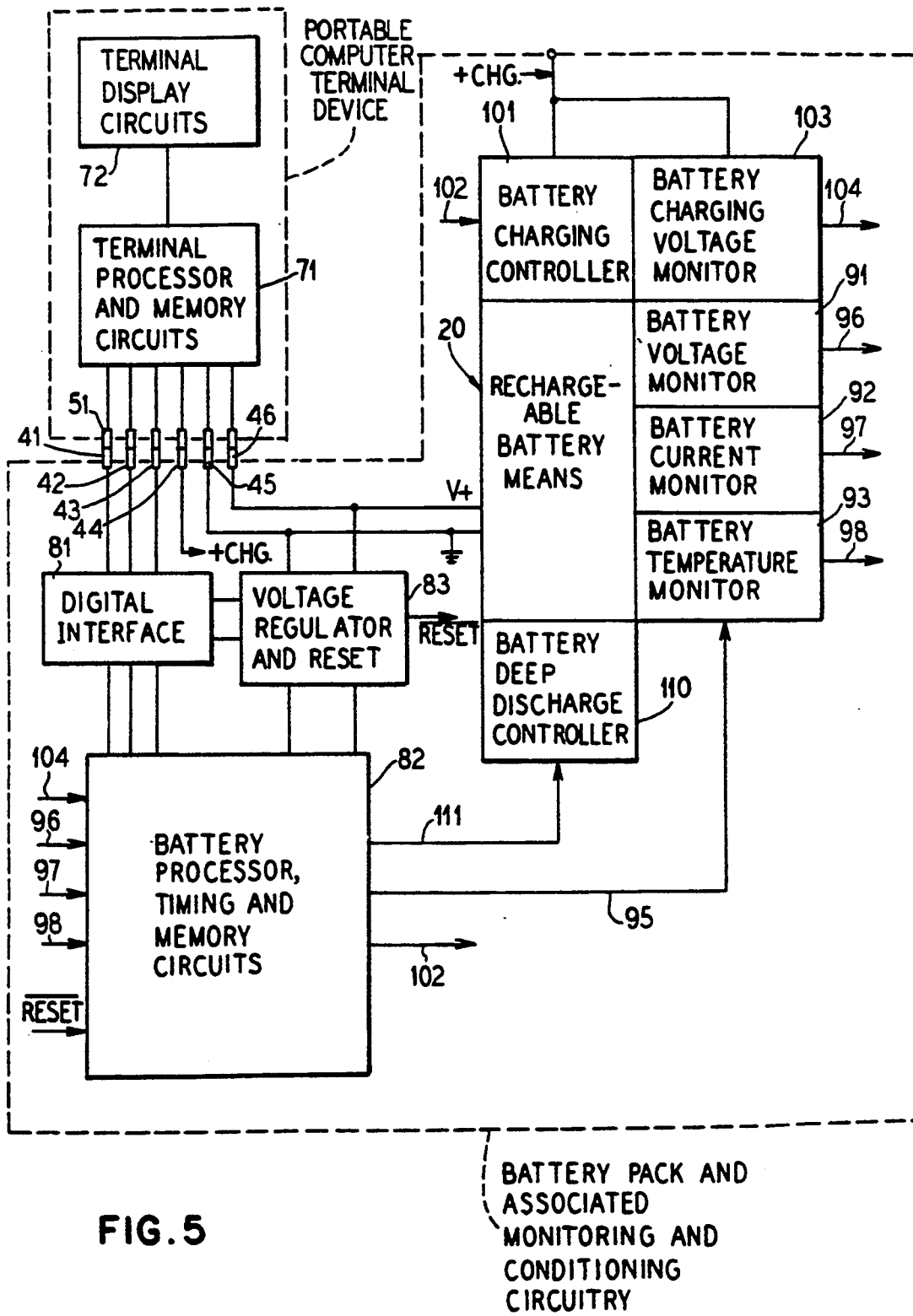
Figure 6:
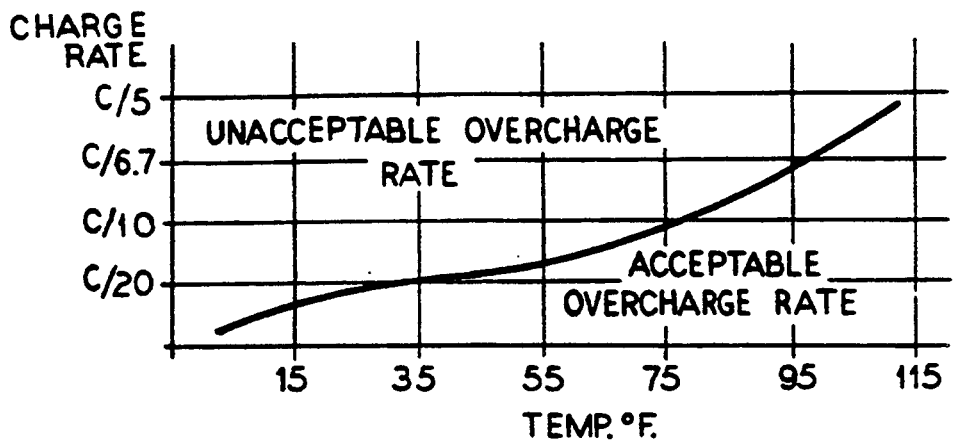
Figure 7:
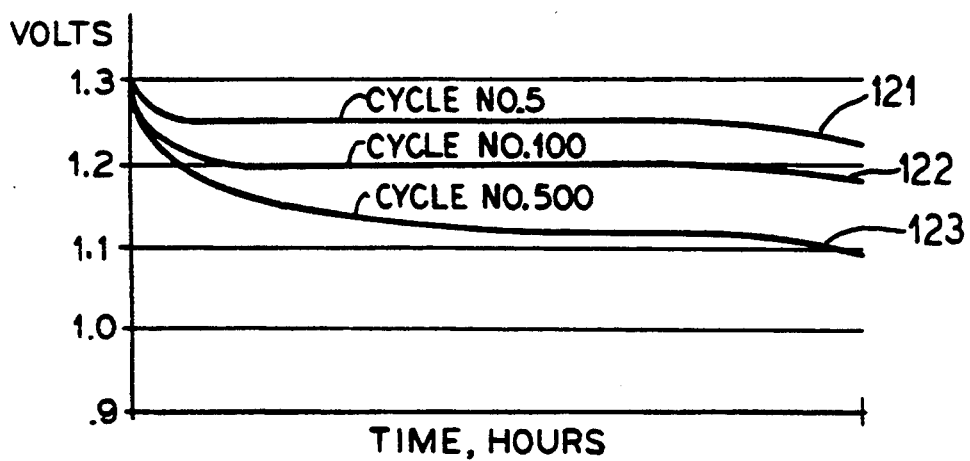
Figure 8:
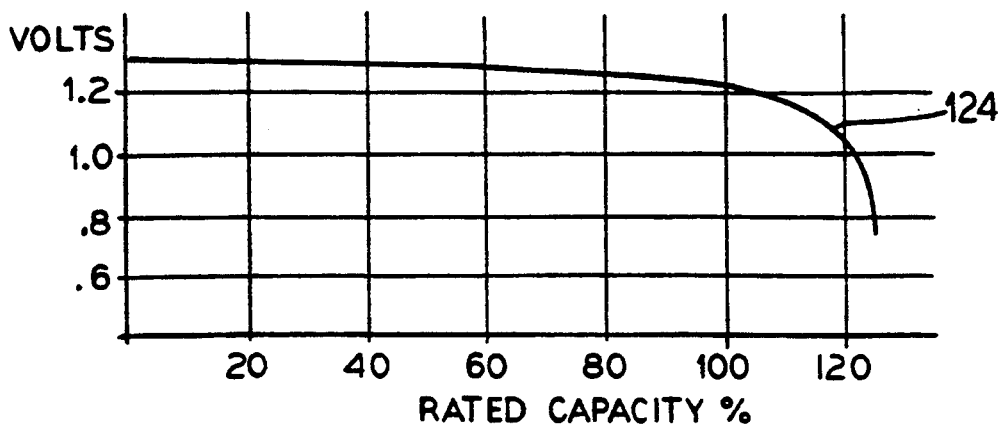

Other stored machine readable tables of computer system 28-10 or 32-10 may include acceptable maximum overcharge rates as represented in FIG. 6 and have charge rates, e.g., as described at Col. 9, line 26 to Col. 10, line 32 of the incorporated U.S. Pat. No. 4,455,523. Such stored tables would insure that the charging system of FIG. 28 or FIG. 32 would be compatible with a battery means such as shown in FIG. 5 or in FIGS. 9A and 9B. For example, the stored table for the battery means of FIGS. 9A and 9B could take account of internal heating within the internal regulator 173 of the battery pack and insure that the current to the battery (20, FIG. 5) and to the battery load did not exceed the power dissipation capacity of the internal regulator network (173, FIG. 9A).

Figure 9A:
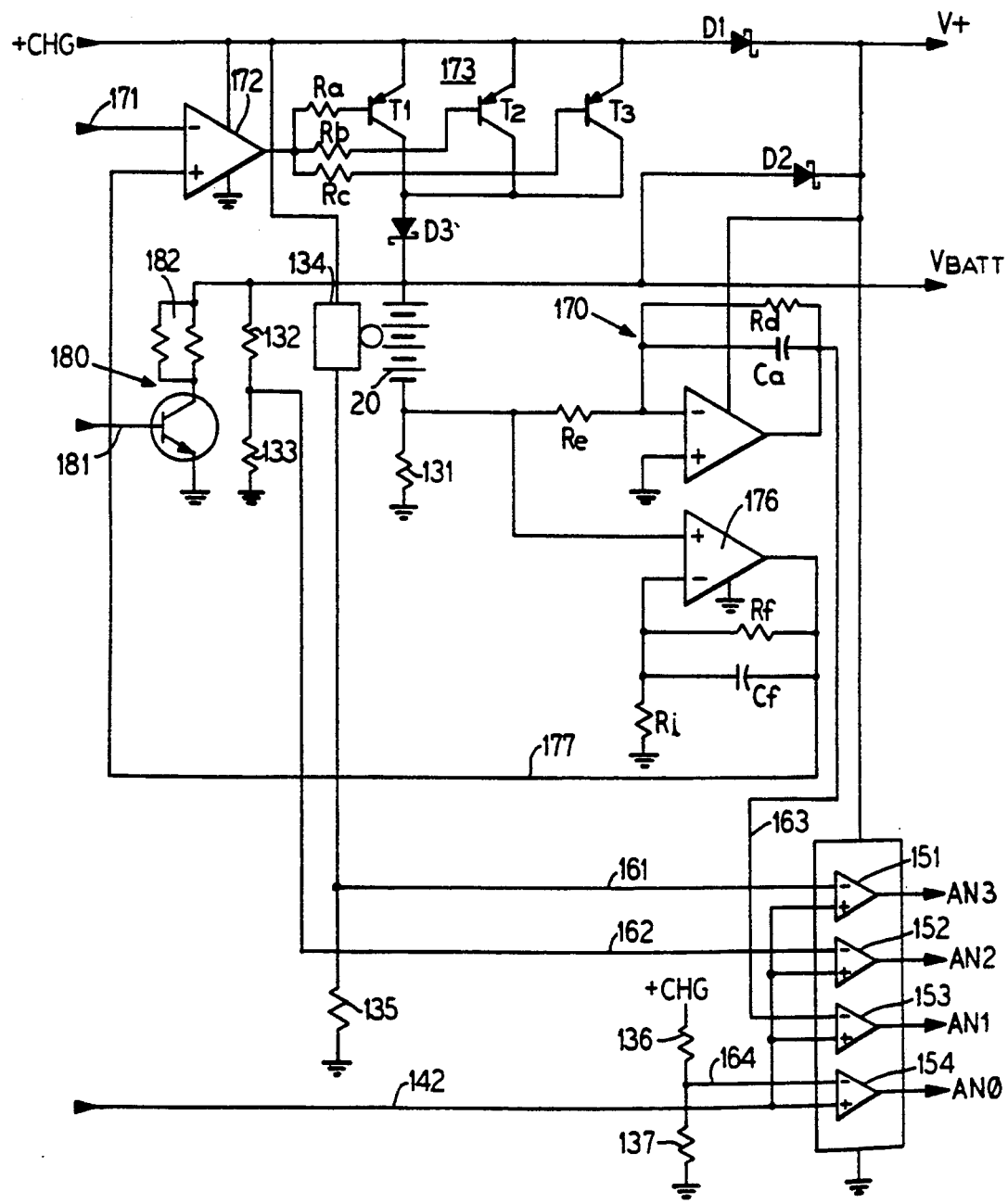

The current regulator 28-20 may be controlled to provide a voltage VCHG at the line CHG in FIG. 9A of approximately seven volts which would result in minimum power dissipation in the interior regulator network (173, FIG. 9A). The presence of an internal current regulator within a hand-held terminal unit is indicated at 26-28, FIG. 26, and charging current control circuit 26-22 could conform with the embodiments of FIGS. 28-36 in the selection of charging and overcharge current values while tending toward minimum power dissipation in the internal regulator network (173, FIG. 9A). The presence of an internal current regulator within a hand-held terminal unit is indicated at 26-28, FIG. 26, and charging current control circuit 26-22 could conform with the embodiments of FIGS. 28-36 in the selection of charging and overcharge current values while tending toward minimum power dissipation in the internal regulator 26-28.

Figure 23:
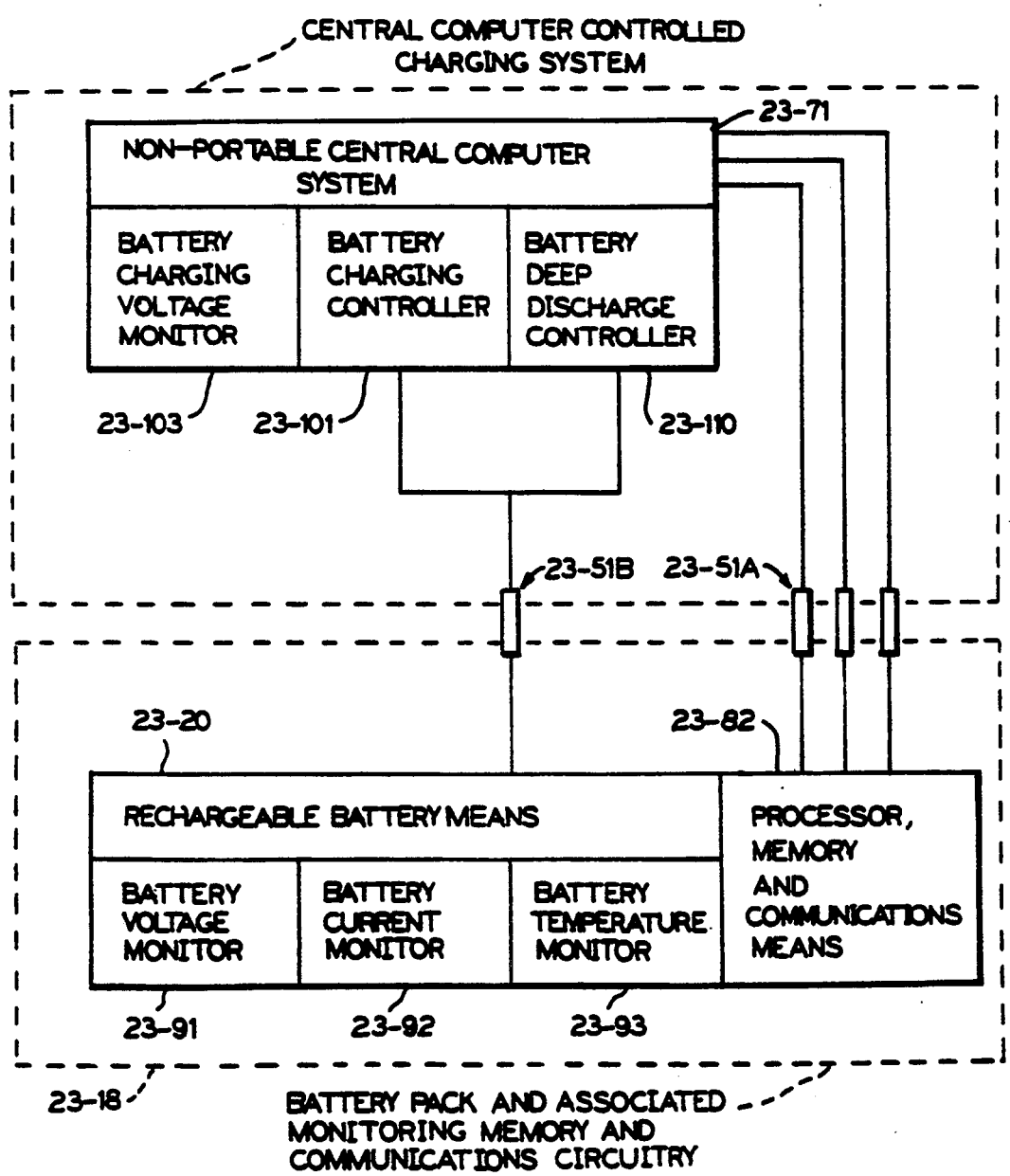
FIG. 23 illustrates a battery conditioning system as described at col. 17, lines 51-68 of the incorporated U.S. Pat. No. 4,455,523, and wherein two-way communication may be established between memory means associated with a portable unit comprised of rechargeable battery means, and non-portable central computer controlled conditioning station.
Figure 24:
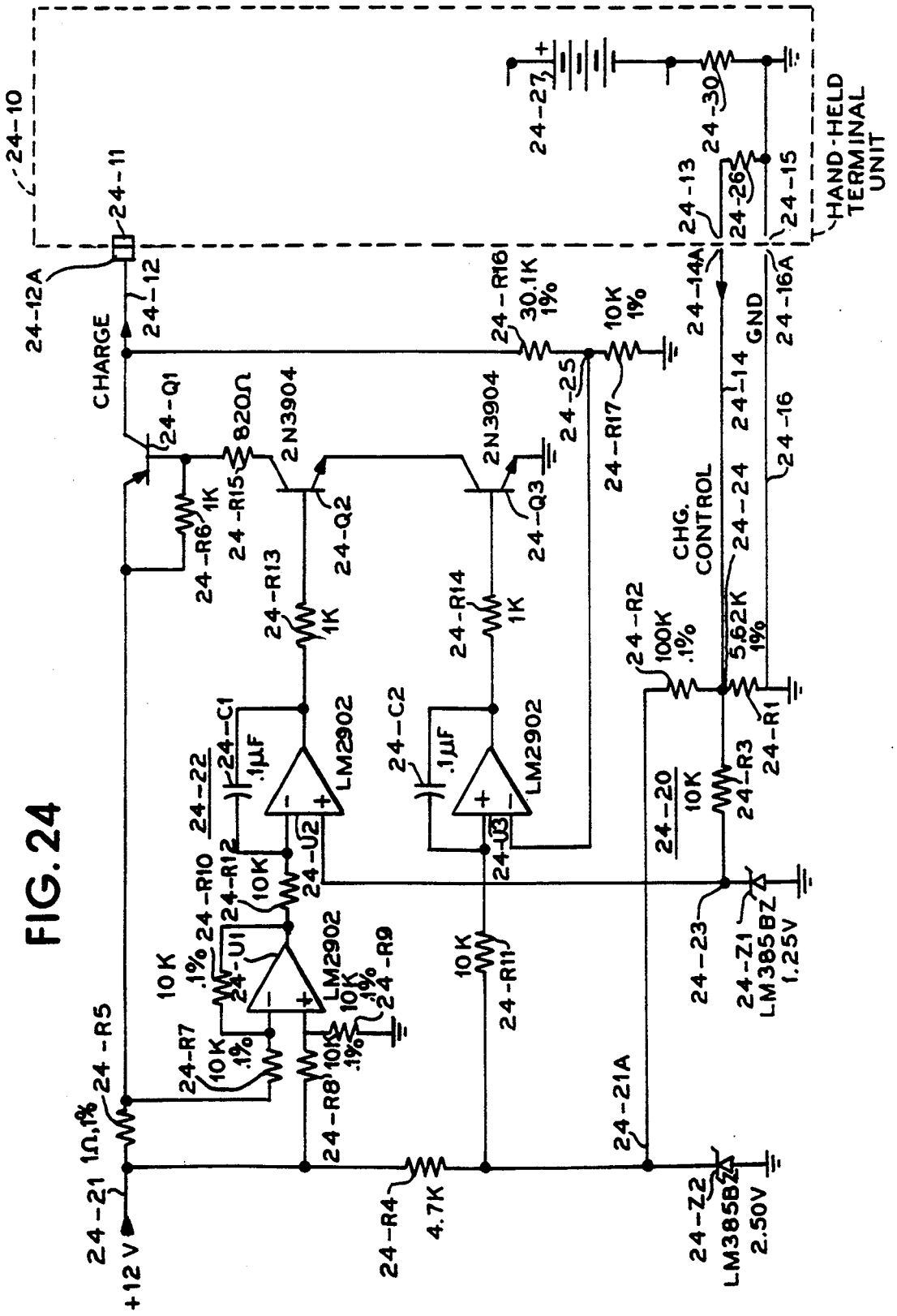
FIG. 24 shows a battery conditioning system wherein a battery identifying circuit element directly controls the set point of a battery charging circuit to determine a battery charging parameter, e.g., battery charging current.
Figure 25:
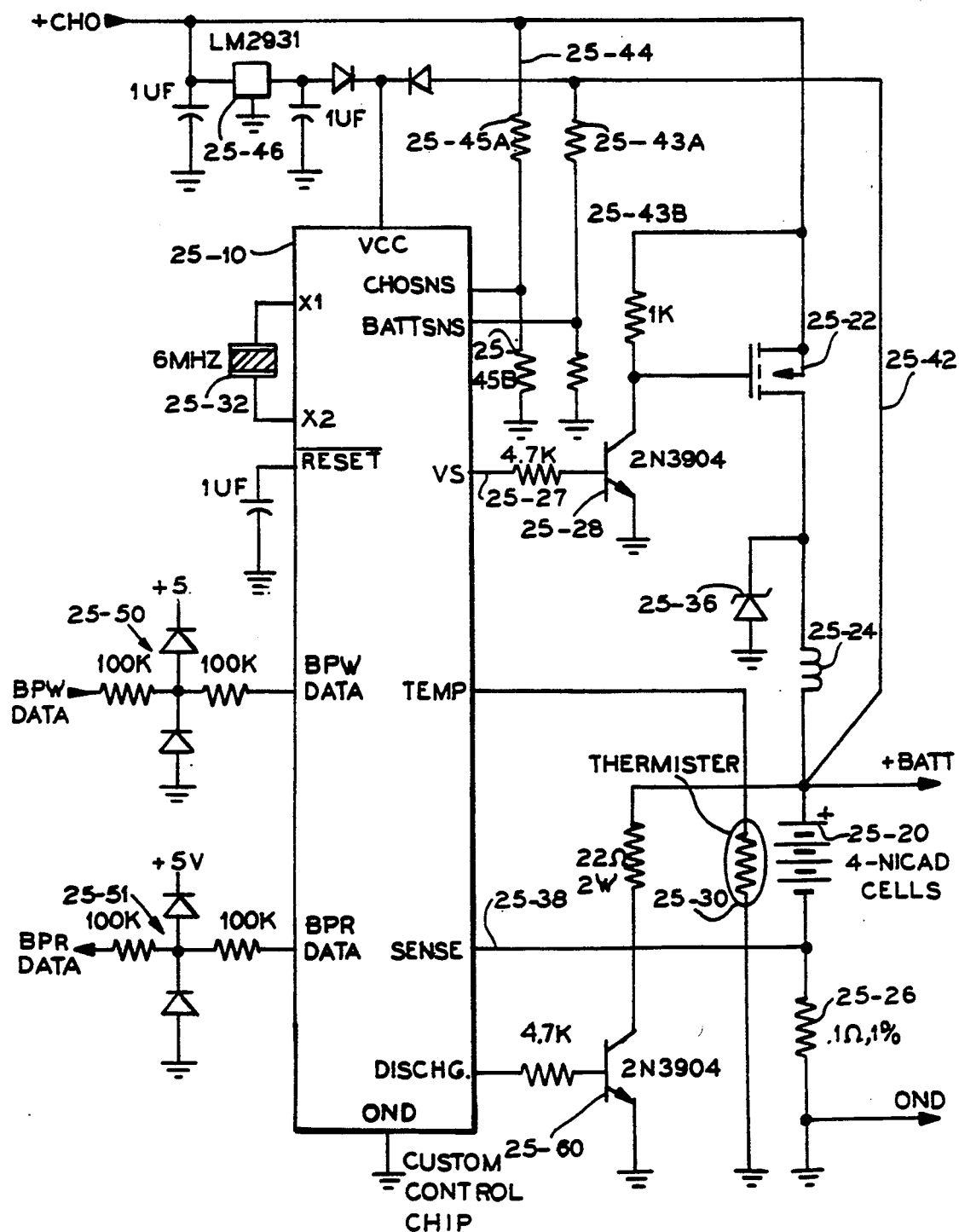
FIG. 25 shows a highly integrated semiconductor device, e.g. for implementing the system of FIGS. 18–22.
Figure 26:
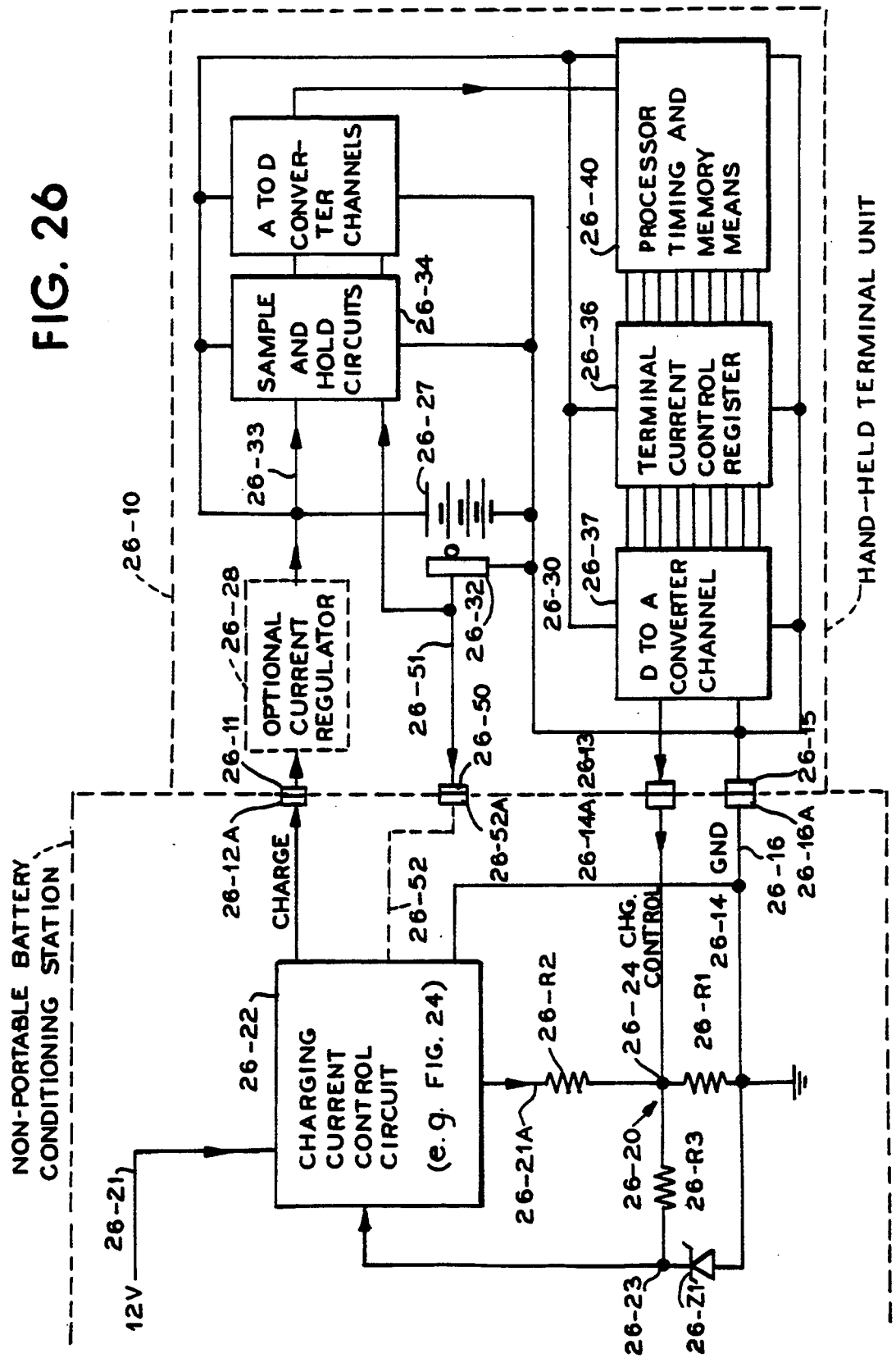
FIG. 26 is an electric circuit block diagram showing a battery conditioning system wherein a preferred handheld terminal unit contains battery parameter sensing means and computer operating means for optimizing battery charging current as supplied by an external circuit (which may correspond with a standardized circuit such as shown in FIG. 24 applicable to a complete family of hand-held terminals)
Figure 27:
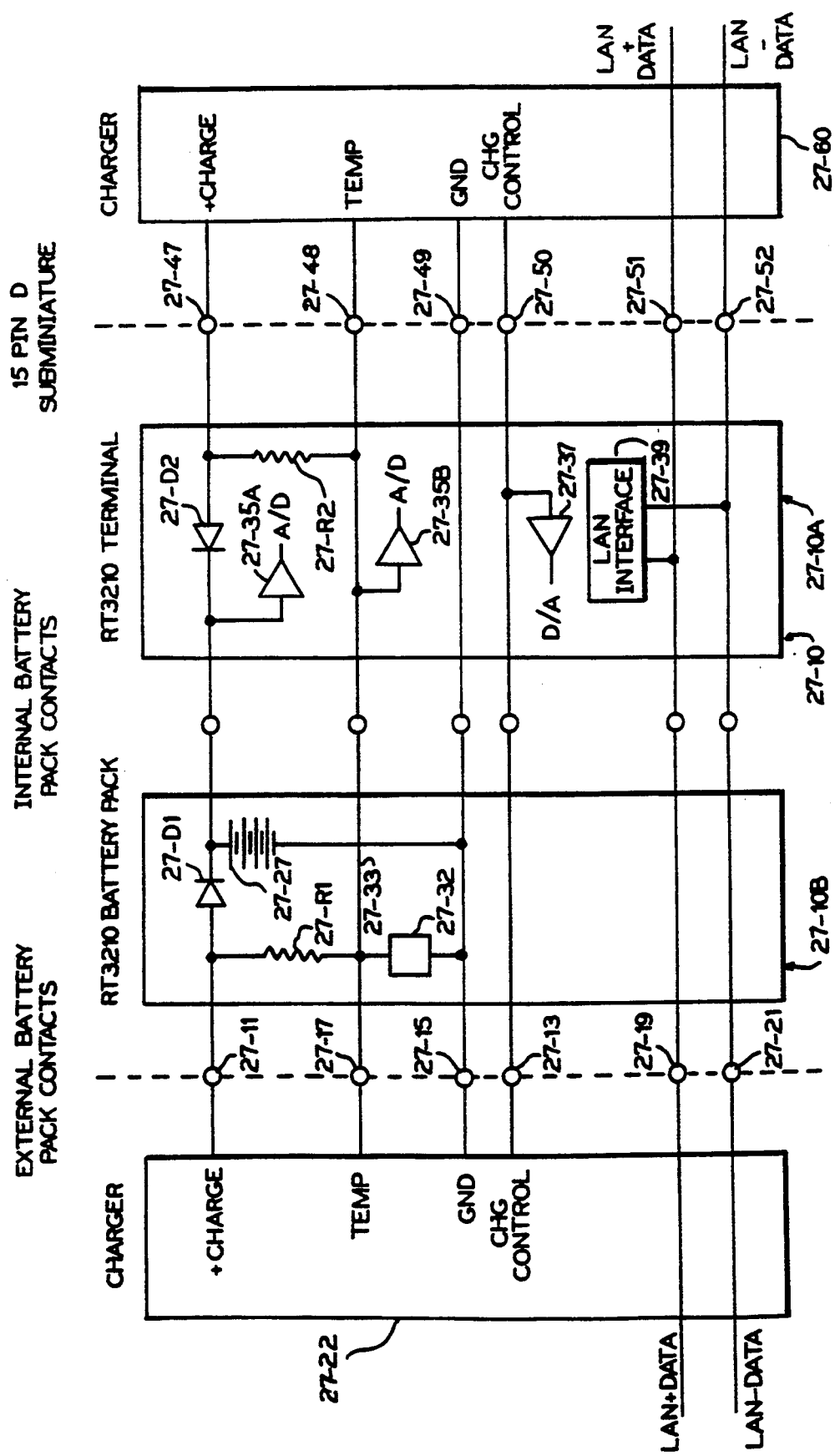
FIG 27 shows a new RF terminal unit including charge control and temperature transducer outputs as in FIG. 26, and also incorporating an interface for coupling with a local area network so as to enable batch transmission of data to and from the RF terminal.

In a different embodiment, each battery pack could have an internal digitally stored identification code digitally stored in the battery pack and accessible to an external microprocessor system such as 28-10 or 32-10 as in the embodiment of e.g. FIG. 23 (via contacts 23-51A), FIG. 25 (via data output 25-51), FIG. 26 (via components 26 26, 26-37, 26-20 and 26-23), or FIG. 27 (via D to A component 27-37 or LAN interface 27-39).

Instead of bringing battery temperature up to ambient temperature as in steps 29-15 to 29-19, it would be conceivable to establish ambient temperature to match battery temperature, and then proceed with a test for overcharge condition as in steps 29-20 to 29-23. Similarly before steps 29-24 to 29-27, where the battery is initially at a low temperature, it would be conceivable to control ambient temperature so as to bring battery temperature up to zero degrees celsius or six degrees celsius by control of ambient temperature alone, or in combination with a suitable charging current. In this way, a relatively high charge rate according to FIG. 34 would be suitable, e.g., at least 0.6° C., and a maximum overcharge rate according to FIG. 33 would quickly be appropriate for the overcharge cycle of steps 29-28 and 29-29.

The stored charge rate information can take the form of end points such as 33-1, 33-2; 33-2, 33-3; 33-3, 33-4, FIG,. 33, for successive substantial straight segments such as 33-11, 33-12 and 33-13, so that the microprocessor could interpolate a precise charge rate multiplier for any measured battery temperature. Thus, if segment 33-12 had end points at −20° C., 0.060 units and at −10°, 0.100 a battery temperature of −19° might be computed to correspond to 0.064 by linear interpolation. Of course of course the points given in Tables I and II could be similarly interpolated to obtain intervening more precise overcharge and fast charge values.

Figure 9B:
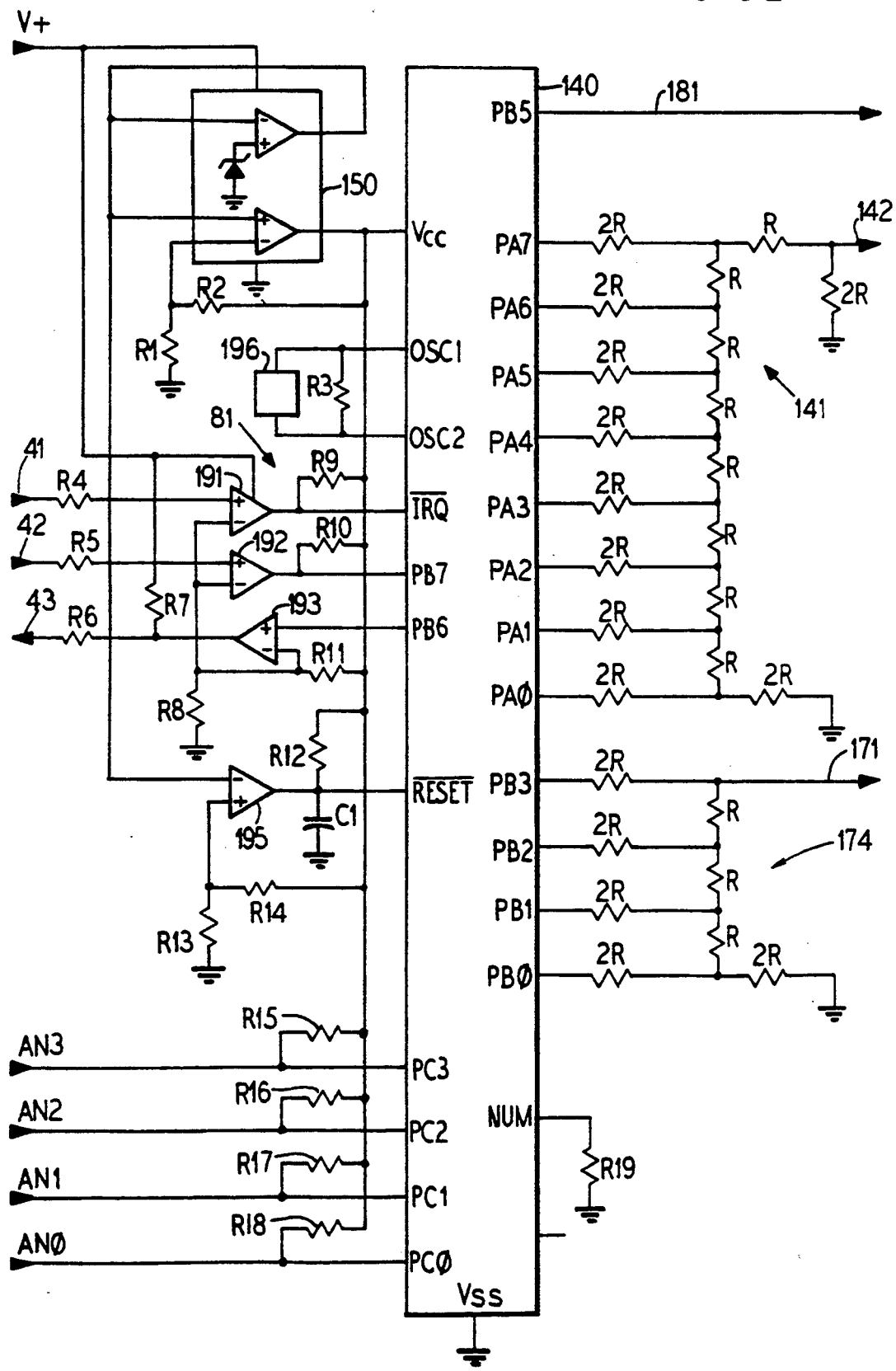
Figure 10:
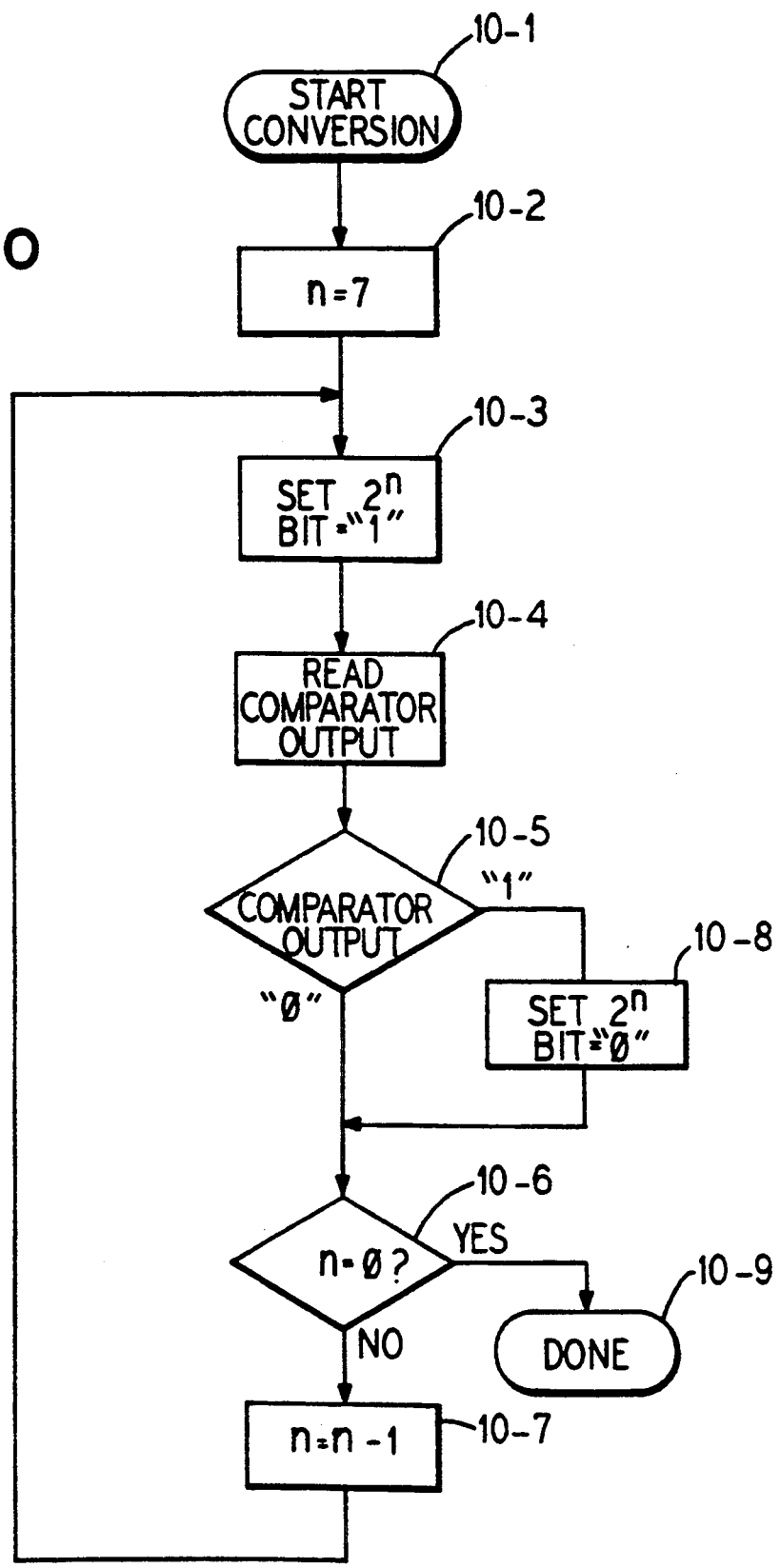
Figure 11:
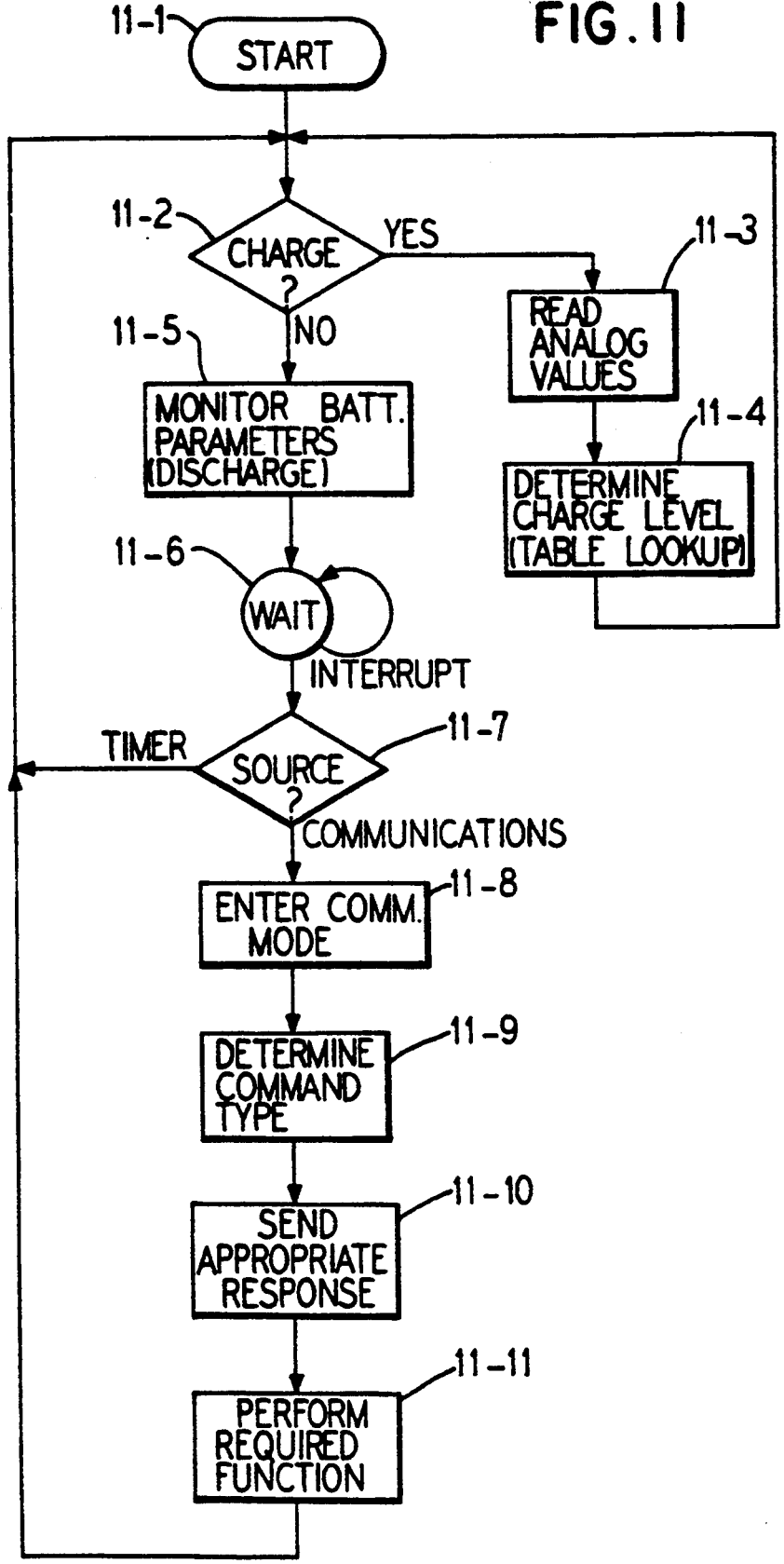
Figure 12:
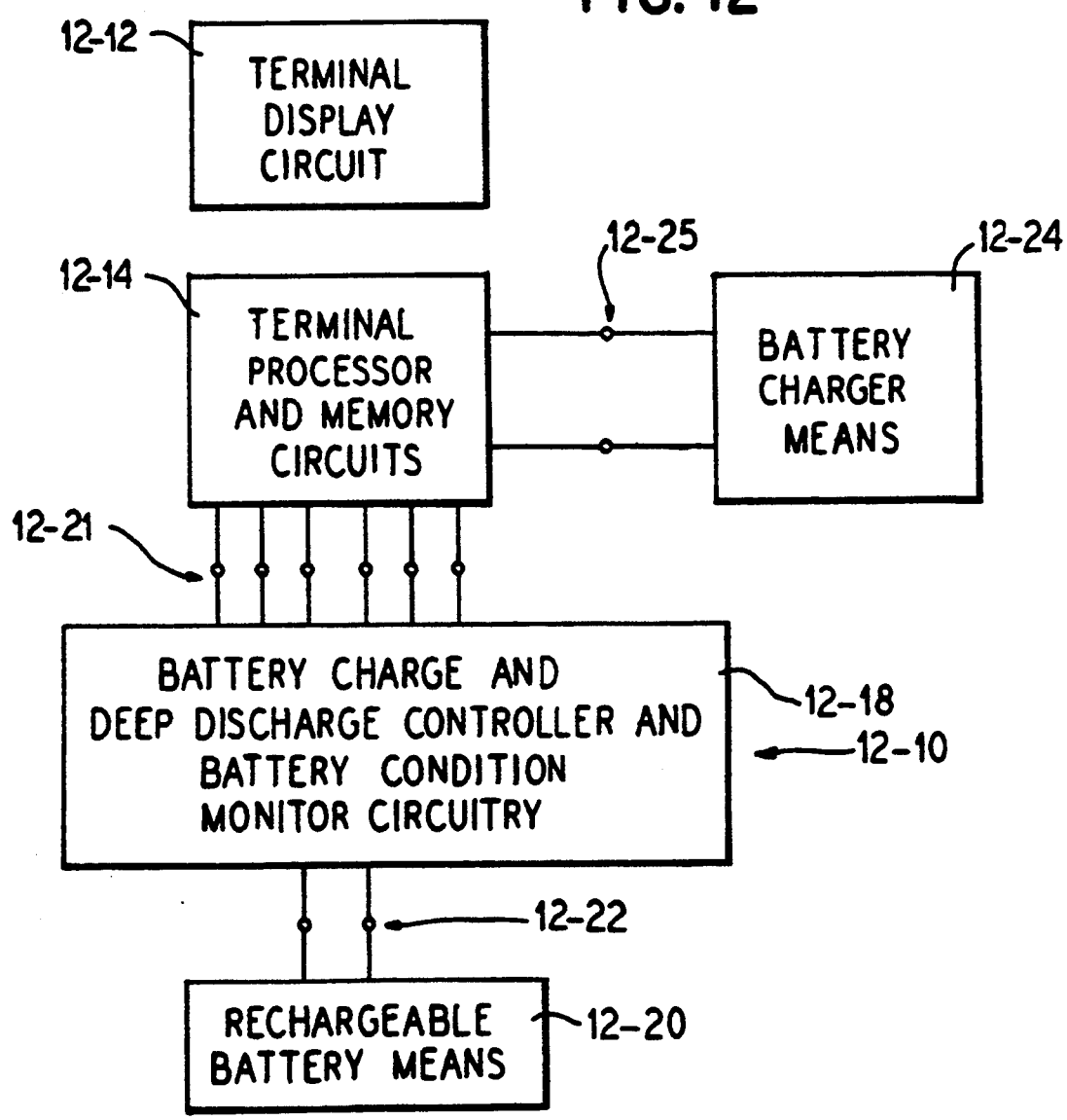
Figure 13:
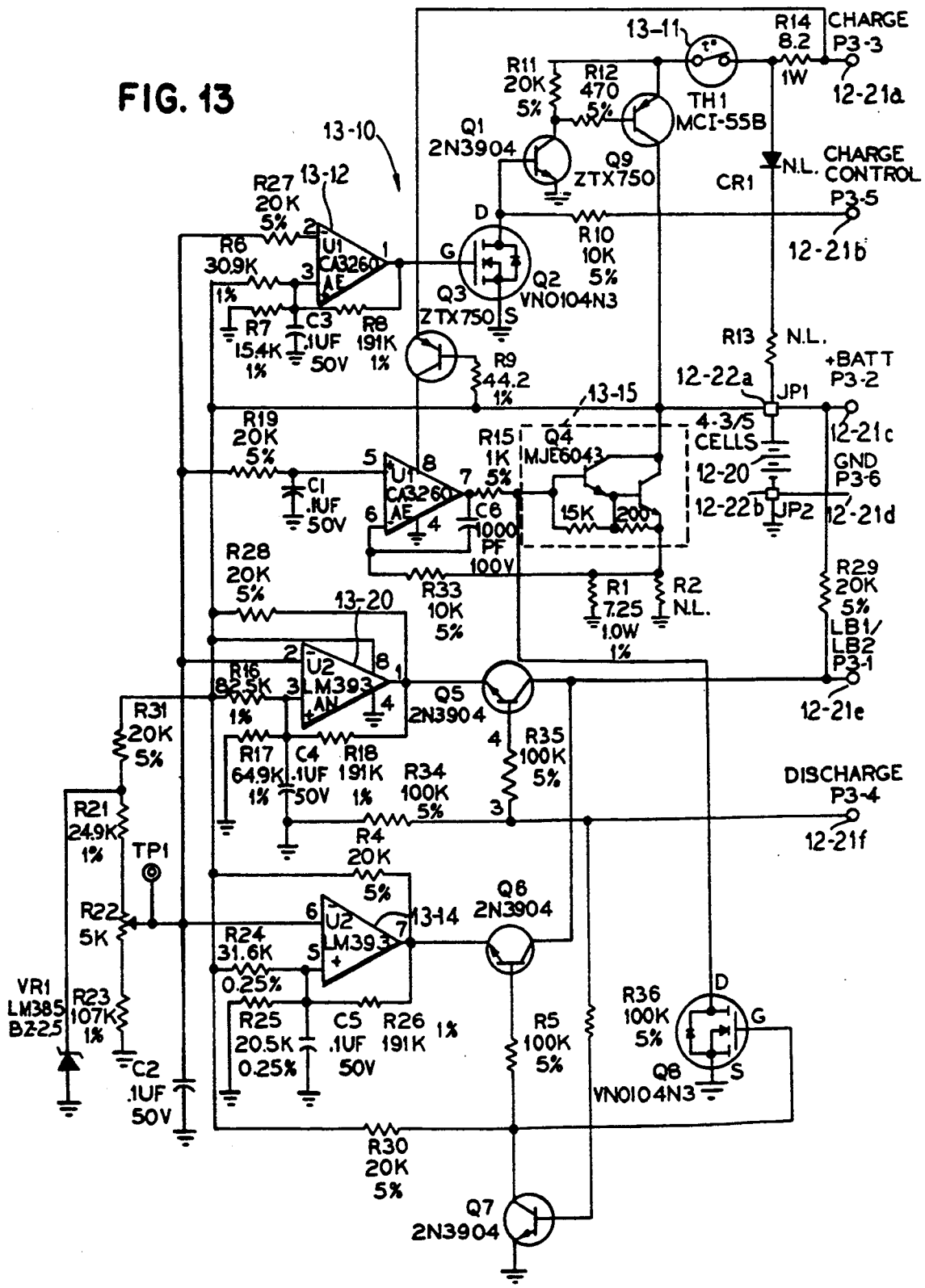
Figure 14:
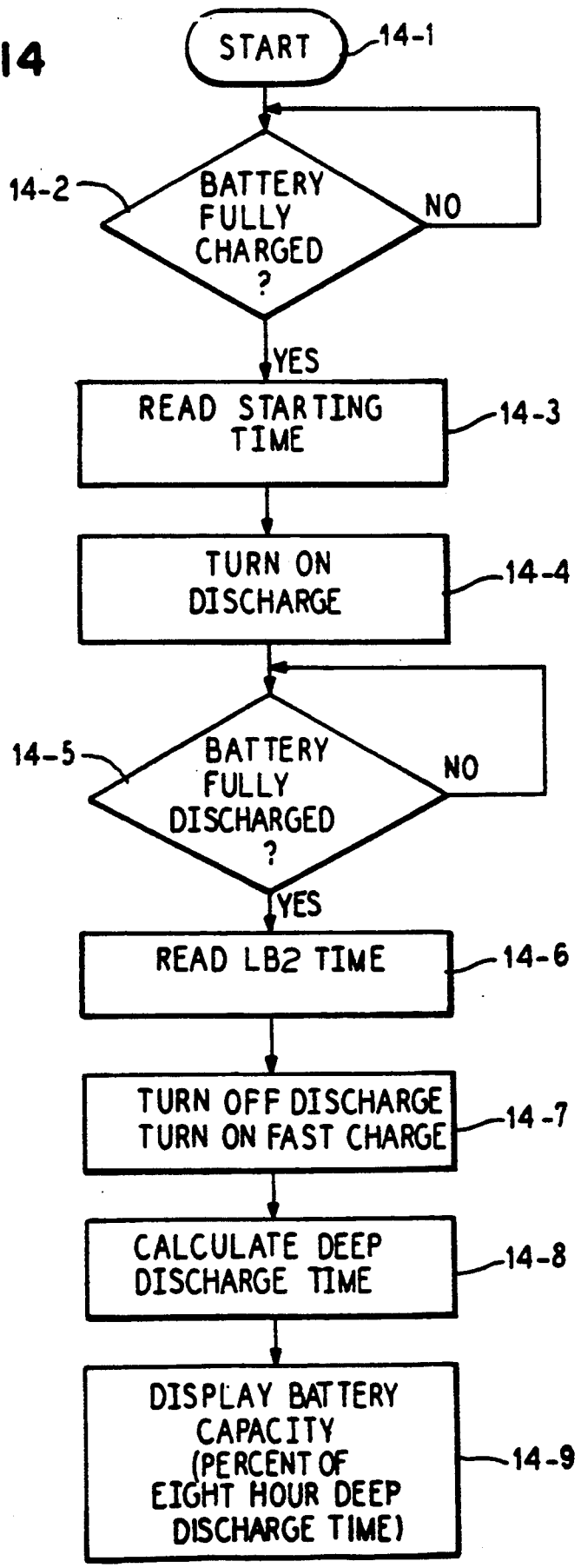
Figure 15:
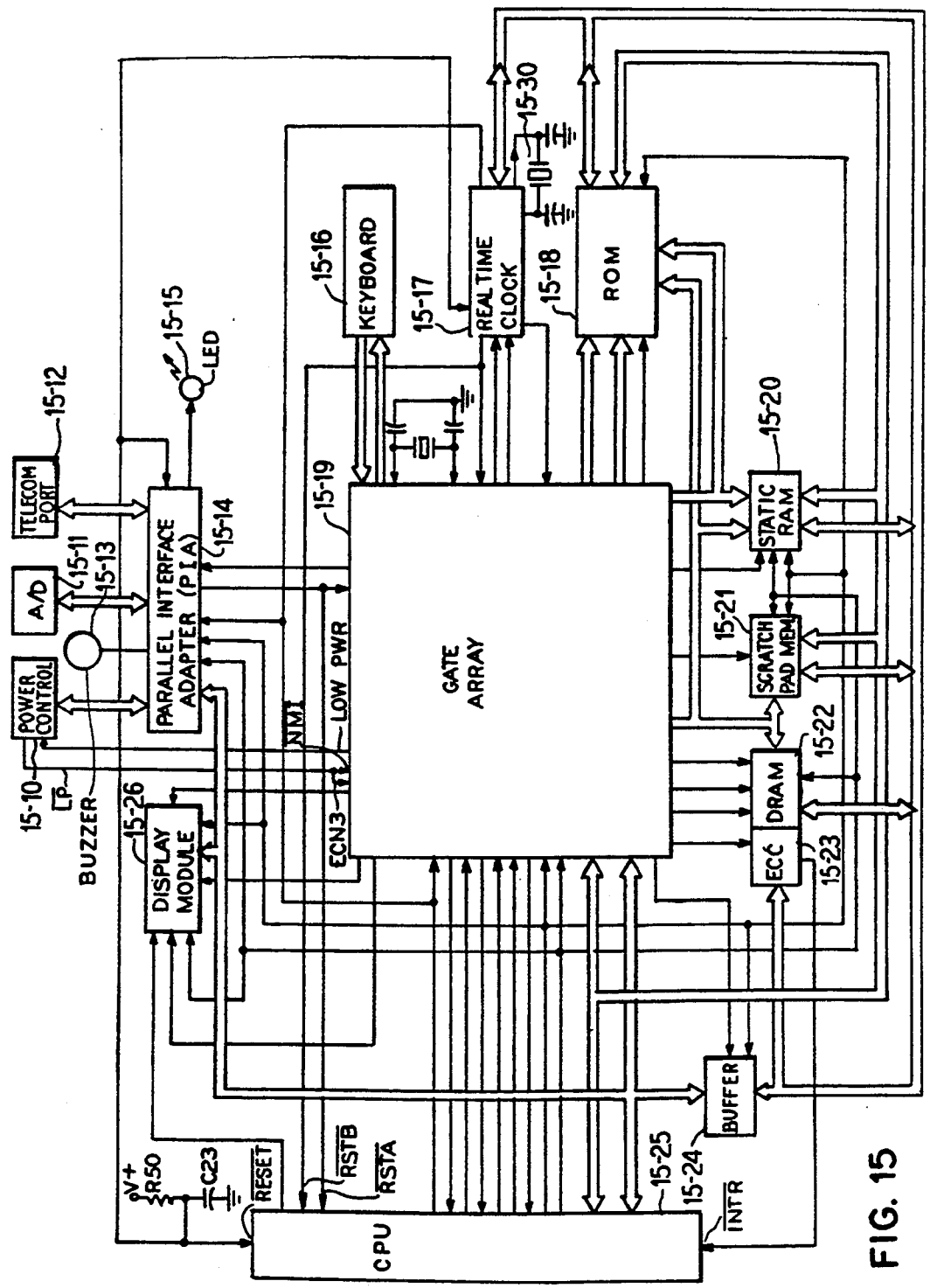
Figure 16A:
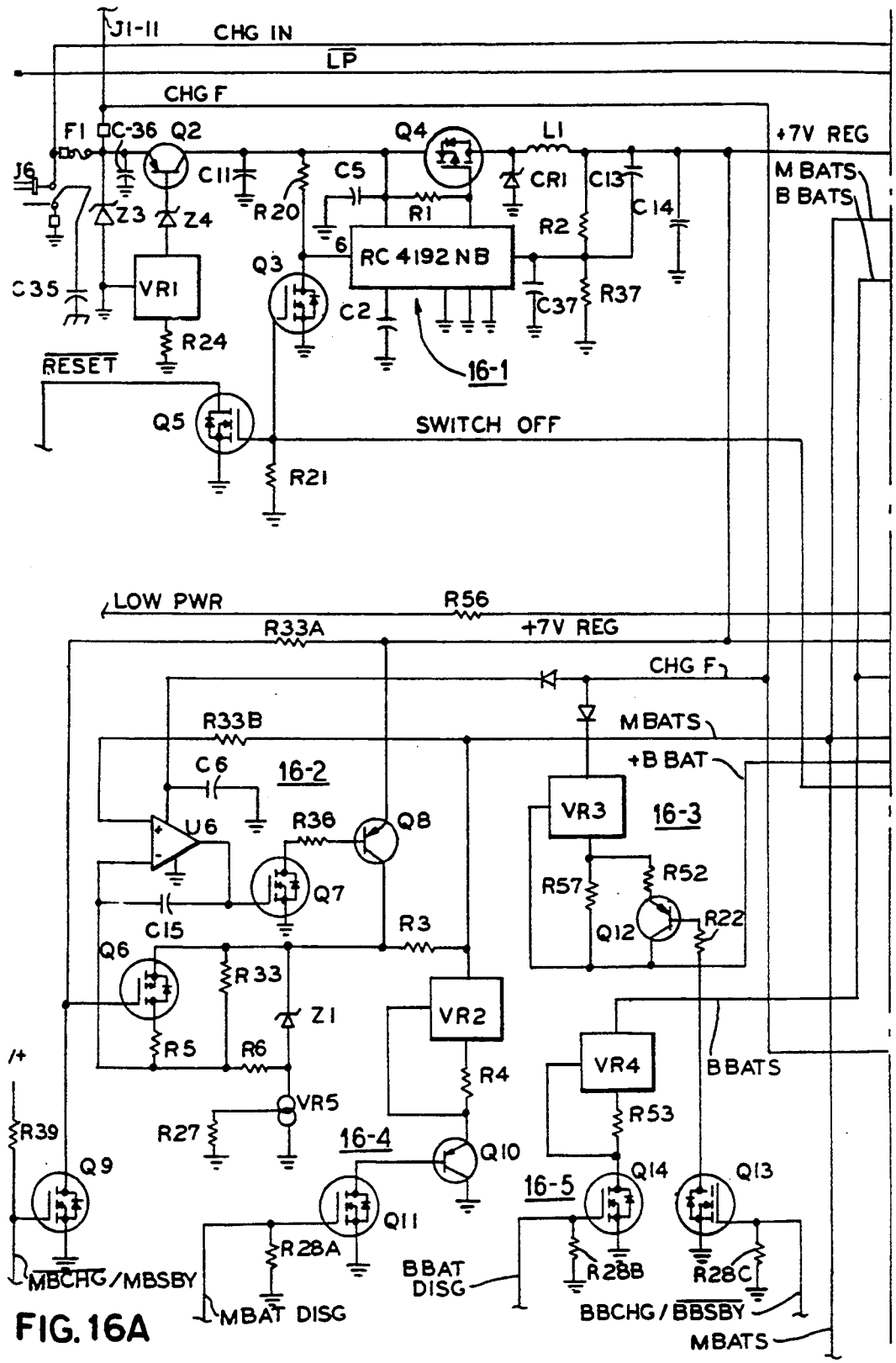
Figure 16B:
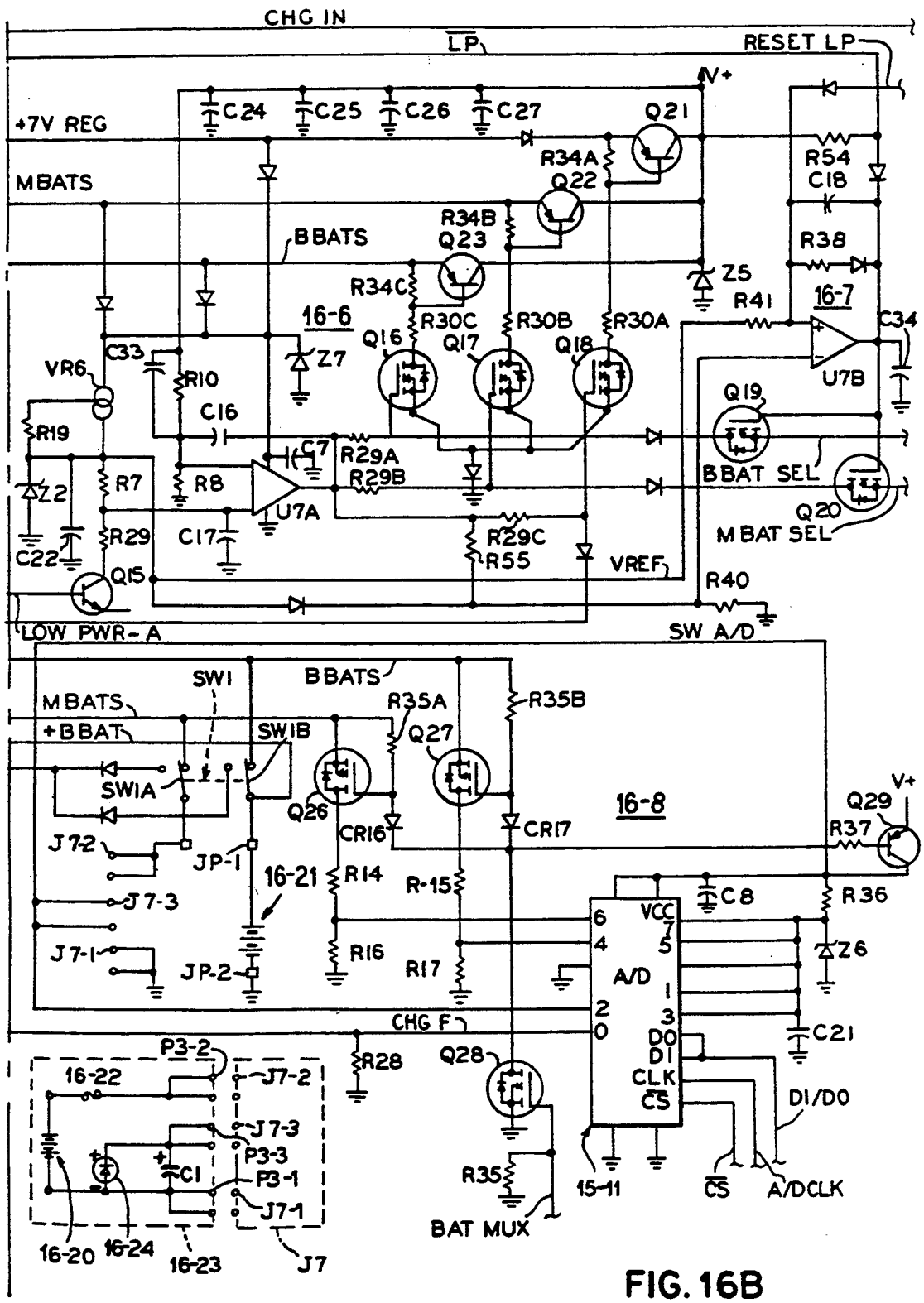
Figure 17:
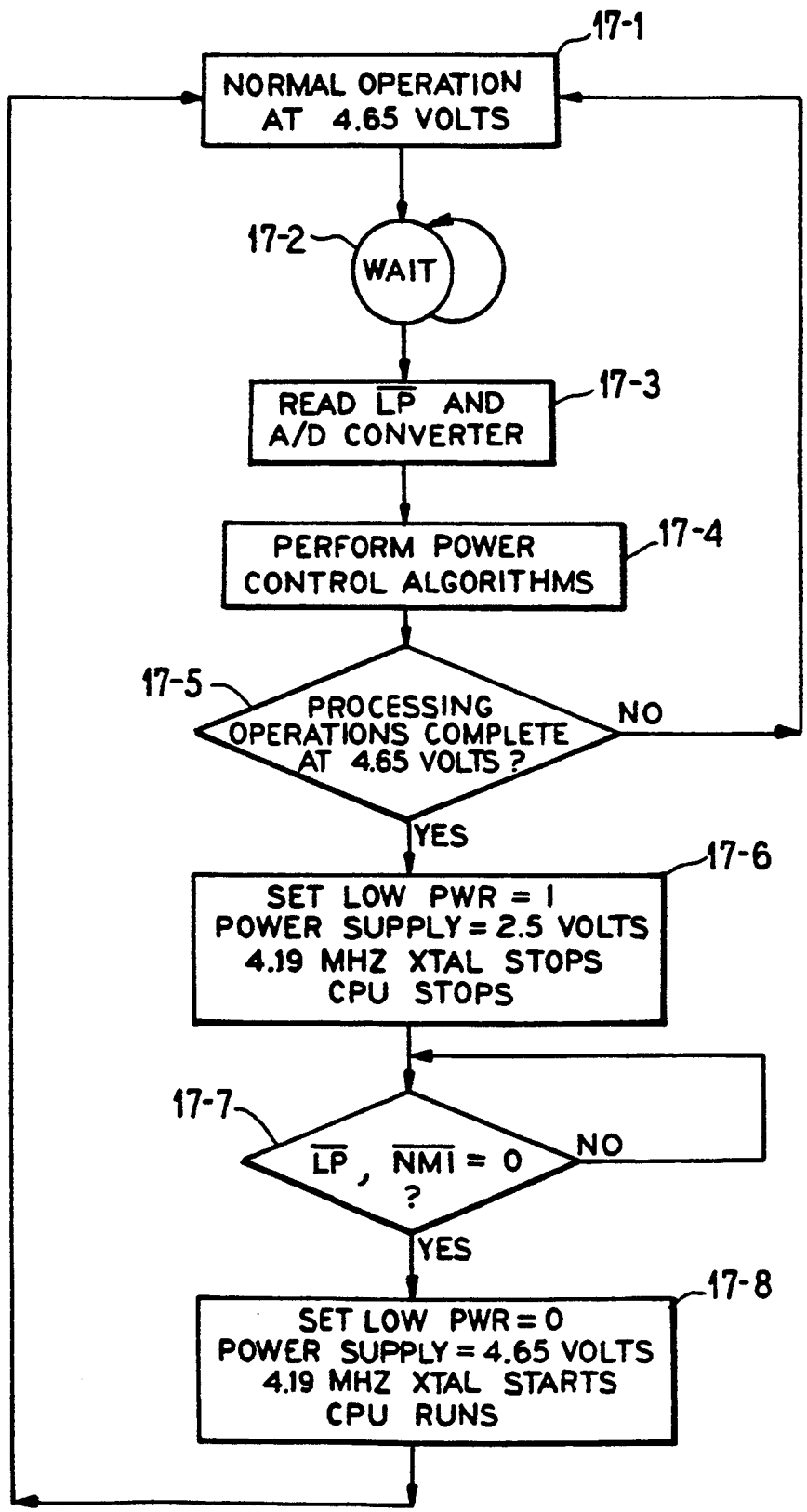
Figure 18:
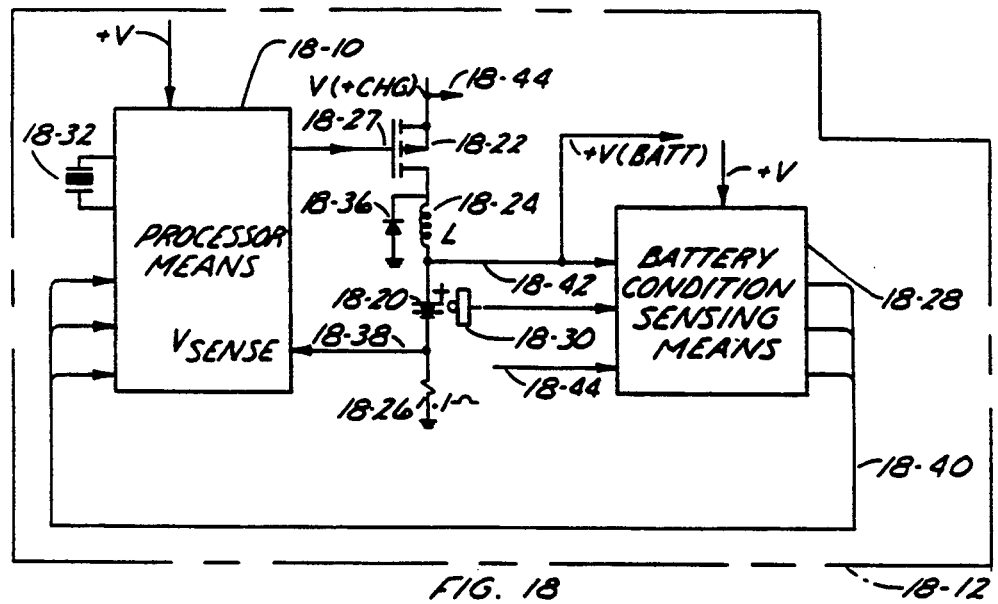
FIG. 18 is an electric circuit diagram for illustrating a preferred embodiment of battery charging current control system in accordance with the present invention.
Figure 19:
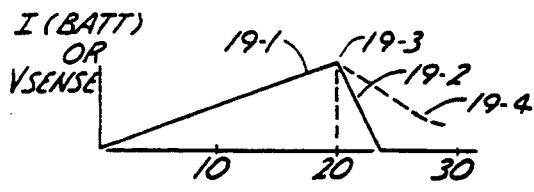
FIG. 19 shows an exemplary current pulse waveform which may correspond with a maximum battery charging rate in a substantially linear operating range for an exemplary control system in accordance with FIG. 18.
Figure 22:
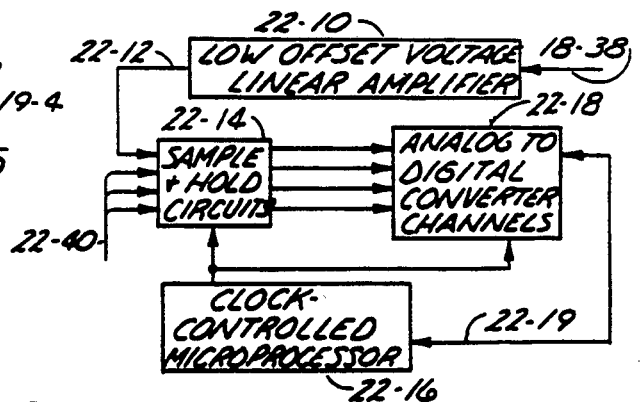
FIG. 22 is a block diagram for illustrating exemplary sampling circuitry for association with the V sense input of the processor means of FIG. 18.
Figure 21:
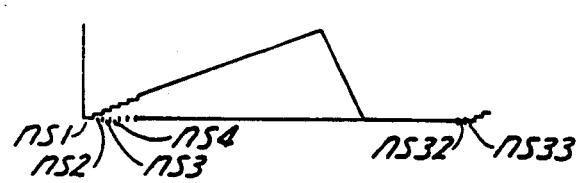
FIG. 21 is a diagrammatic view of use in explaining the aliased sampling of actual current pulses in the battery charging circuit, and illustrating the case where thirty-two samples form a complete sampling cycle.
Figure 20A:
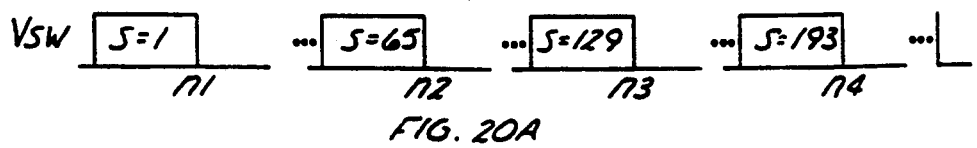
FIG. 20A shows selected control pulses which may be generated during control of battery charging current in the control system of FIG. 18.
Figure 20B:
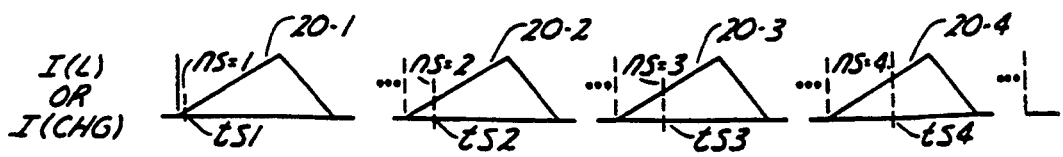
FIG. 20B shows respective corresponding battery charging current pulses on the same time scale with vertically aligned portions of the waveforms of FIGS. 20A and 20B occurring at the same time.

With respect to steps 29-7 to 29-12, an internal microprocessor such as in FIG., 5 or FIGS. 9A, 9B may determine battery load current and communicate the same to an external microprocessor such as 28-10 as shown in FIGS. 23, 25, 26 or 27, for example, FIG. 28 may represent the association of a non-portable battery conditioning station including components 28-10, 28-17 and 28-20 with a hand-held terminal unit containing a quickly removable battery pack 28-25 comprised of a nickel-cadmium rechargeable battery 28-15 and a battery temperature sensor 28-16 within housing 28-22. The hand-held terminal unit may provide load means 28-21, which may comprise a dynamic random access memory and other circuitry which is to be continuously energized during a charging operation.

As in the embodiment of FIG. 30, the hand-held terminal units which are to be associated with components 28-10, 28-17 and 28-20 may include coupling means such as 30-21, 30-21A, 30-22, 30-23 and 30-24 which are automatically engaged with cooperating coupling means of the charging station when the handheld unit is bodily inserted into a receptacle of the charging station. The coupling means 30-21 and 30-21A in FIG. 30 would be represented in FIG. 28 by a line (+ BATT) from component 28-20 corresponding to line 28-26, and a further line (+CHG) leading to a network (representing components 30-28 and 30-29) in turn connected with battery 28-15 and line 28-11.

An exemplary charging station adaptable for a handheld unit including battery pack 30-27 of FIG. 30 is shown in greater detail in FIG. 27.

Where FIGS. 28–36 are applied to a system as represented in FIG. 27, components 28-10, 28-17 and 28-20 would be part of charger station 27-22. Line 28-26 would lead to a charging station contact engageable with external battery pack contact 27-11. Input line 28-12 would be connected via a further set of mating contacts with internal battery pack contact 27-61. Input line 28-11 would connect with contact 27-17. Alternatively, charger station 27-22 would have a LAN interface corresponding to 27-39 and would receive digital information as to battery terminal voltage for example via amplifier 27-35A, an A to D converter of terminal 27-10A, LAN interface 27-39 and LAN data coupling means 27-19, 27-21. The charging station would then charge the battery packs such as 27-10B of terminals such as 27-10A in accordance with the embodiments of FIGS. 28–36. In place of amplifier 27-37, (representing components 26-36, 26-37), an identifying shunt voltage regulator 30-10 would be part of each battery pack 27-10B.

As a further embodiment, the charger station 27-22 could comprise the components of FIG. 32, the line 28-12 being coupled with a battery such as 27-27 via mating terminals 32-21 and 27-11 and through forward biased diode 27-D1, for example. In this embodiment terminal 27-13 would mate with terminal 32-24, and battery pack 27-10B would conform with battery pack 30-27 for example by including a respective identifying shunt regulator 30-10, and e.g., nickel-cadmium batteries with respective characteristics as shown by FIGS. 33 to 36 and Tables I and II.

Summary of operation of FIGS. 28–36

Operation of the specific exemplary embodiment as presented in FIG. 29 may be summarized as follows.

As represented by steps 29-2 and 29-3, the presence of a battery pack 28-25, FIG. 28, or 30-27, FIG. 30, may be sensed by means of the input 28-11, FIG. 28 or FIG. 32, from battery pack temperature sensor 28-16, FIG. 28, or 30-26, FIG. 30. A non-zero voltage input level on line 28-11 may signal the presence of a battery pack 28-25 coupled with components 28-10 and 28-20. The physical connections may be analogous to those of FIG. 26, for example, an exemplary arrangement of terminals for a battery pack 30-27 being shown in FIG. 30.

Referring to FIG. 31, the load current may be automatically sensed by means of steps 29-7 to 29-11 since battery voltage as measured at 28-12, FIG. 28 or FIG. 32, will not increase until a current Ichg, FIG. 30, in excess of battery load current Iload is applied to line 28-26, FIG. 28.

Where the battery pack has a given upper temperature limit which must be observed to avoid detriment to battery life, the battery may be automatically allowed to cool to a suitable temperature (e.g. 40°) if it is introduced into the charger at an unacceptably high temperature. This is represented by steps 29-13 and 29-14 which may be automatically performed by microprocessor 28-10 or 32-10 according to battery temperature (Ptemp) as sensed at input 28-11, FIG. 28 or FIG. 32.

As explained in reference to FIG. 36, in order to detect the battery overcharge condition, the microprocessor 28-10 or 32-10 automatically performs steps 29-15 to 29-19 to assure that battery temperature as measured at input 28-11 is not substantially lower than ambient temperature as sensed at input 28-13. Once battery temperature is at least essentially equal to ambient temperature, steps 29-20 to 29-23 are effective to automatically determine whether the battery is to receive a fast charge according to steps 29-24 to 29-27, and e.g. FIG. 34, or whether the microprocessor 28-10 or 32-10 is to govern the supply of charging current at 28-26 according to steps 29-28 and 29-29 and e.g. FIG. 33.

Discussion of Terminology

From the foregoing, it will be understood that steps 29-20 to 29-23 are effective where the battery system can be made to exhibit a temperature characteristic which rises as a function of overcharge current over a given time interval generally as illustrated in FIG. 32. Another example may be a nickel hydride type battery. To accomplish this the charging system may operate automatically as in steps 29-15 to 29-19 to insure that the battery means has a state such that its temperature will not increase at a substantial rate due to a higher ambient temperature (e.g. as in FIG. 36). In particular, the state of the battery means may be automatically assured to be such that it will exhibit a substantially greater increase in battery temperature in response to a given selected charge rate when the battery is in overcharge condition that when it is not in such a overcharge condition.

As represented by step 29-20, the current automatically applied to the battery means exceeds battery load current by a substantial overcharge magnitude, e.g. twice the overcharge value obtained from FIG. 33, but the application is of limited duration (e.g. ten minutes per step 29-20) such as to void substantial detriment to the useful life of the battery.

According to steps 29-22 and 29-23, the microprocessor system automatically determines whether any increase in battery temperature due to step 29-20 is of a magnitude (e.g. two degrees celsius or greater) which is distinctive of the overcharge condition of the battery means.

From the foregoing TABLE I, it will be understood if battery temperature at step 29-22 has reached thirty degrees celsius, step 29-24 would result in an initial relatively high battery charging current (Ibatt, FIG. 31)

of about 1280 milliamperes if the temperature increases at step 29-23 was not greater than two degrees celsius, while if the increase at step 29-23 were found to be greater than two degrees celsius, step 29-28 would result in supply of a relatively lower battery charging current of about 240 milliamperes.

Where the relatively high battery charging current is applied, battery temperature is measured at regular intervals (e.g. at about one minute intervals per step 29-25) to assure that such high charge rate is terminated sufficiently quickly after overcharge condition is detected so as to avoid any substantial detriment to the useful life of the battery means.

The overcharge relatively lower charge rate is terminated after an overcharge interval so as to insure optimum charging of the battery means without detriment to its useful life.

Of course the charge rate or overcharge rate may be readjusted higher or lower according to FIGS. 33 and 34 at any desired time intervals, e.g. at each step 29-24 in charging mode, and by inserting steps such as 29-25 and 29-26 between steps 29-28 and 29-29 so that overcharge current would be re-selected at suitable intervals such as one-minute intervals.

Referring to the plots of maximum acceptable overcharge rate in FIGS. 6 and 33, it will be observed that there is a minimum temperature for each battery type below which overcharge current is not applied by the microprocessor system 28-10 or 32-10. In FIG. 6, the lower temperature extreme is shown as about zero degrees Fahrenheit (about minus eighteen degrees celsius). At about zero degrees Fahrenheit, the low overcharge rate is less than about capacity divided by fifty. In FIG. 33, the low temperature extreme is about minus thirty degrees celsius where the overcharge current of about 0.04 units corresponds to an overcharge rate of about capacity divided by twenty-five.

Above the lower limit temperature, there is a range of temperatures where the upper overcharge rate exceeds the lower overcharge rate by a factor of at least about four. For example, in FIG. 6, the acceptable overcharge rate at a relatively high temperature of about one hundred and ten degrees Fahrenheit is close to capacity divided by five (0.2° C.), while the acceptable overcharge rate at the low temperature extreme of about zero degrees Fahrenheit is about capacity divided by fifty (0.02° C.) a ratio of overcharge rates of ten to one. According to FIG. 33, the microprocessor system 28-10 or 32-10 may supply values of overcharge at about five degrees celsius of about 0.30 units (C/3.3) while at a low temperature extreme of about minus thirty degrees celsius, the acceptable overcharge rate to be supplied by the microprocessor system is about 0.04 units (C/25), a ratio of about seven to one. Between the temperature values of the temperature range of FIG. 6, the permissible overcharge rate progressively increases with successively higher temperature values such as zero degrees, fifteen degrees, thirty-five degrees, fifty-five degrees, seventy-five degrees and ninety-five degrees (Fahrenheit). Similarly in FIG. 33, between temperatures of minus thirty degrees celsius and about five degrees celsius, the permissible overcharge rate progressively increases for successively increasing temperature values (such as $-20°$ C., $-10°$ C., and $0°$ C.).

Referring to FIGS. 28, 30 and 31, it will be understood that the embodiments of FIGS. 28 to 36 avoid series resistance means of substantial ohmic value such as shown at 131, FIG. 9A, 18-26, FIG. 18, 24-30, FIG. 24, 25-26, FIG. 25, for sensing battery current. Instead charging current source 28-20, FIG. 28, may be automatically operated to supply desired current values in an open loop manner. An automatic sequence such as steps 29-7 to 29-11 may be used to measure load current if this would be a fluctuating and possibly significant amount for a given hand-held terminal unit and would not be reported to the charging station by the hand-held unit. As shown by FIGS. 28, 30 and 31, the battery 28-15 has external terminals e.g. as at 30-21A, 30-22A, FIG. 30, with external circuit means connecting such terminals with the battery, such external circuit means having essentially negligible ohmic resistance such that the battery means supplies load current to a load via the external terminals with minimized ohmic loss at the battery side of said external terminals.

As portable hand-held data and radio terminals continue to be used more widely in certain demanding applications, the need for fast charging of the terminal batteries becomes more significant, The increased use of high powered scanner attachments and peripherals as well as other connected devices often causes the terminal battery capacity to be taxed to the point where only a portion of the intended period of usage may be served with the stored charge available from a single battery pack. Consequently, it has become increasingly necessary to provide multiple packs which may be exchanged in such a way that a depleted pack may be replaced by a fresh one with minimal downtime. When a depleted pack is removed, it should be fully recharged in a least the amount of time that a fresh pack is able to operate the terminal. With a recharging capability of this type, it is then possible for virtually perpetual operation to be provided with as few as two battery packs per terminal.

A similar but further complicated application involves the utilization of the described data terminals on a vehicle such as an industrial fork lift truck. In this type of application, the terminal may receive power for operation from the vehicle the majority of the time. Often, however, it may be necessary for the terminal to be physically removed from the vehicle and operated in a fully portable mode for potentially extended periods of time. For this reason, it is highly advantageous to automatically quickly recharge the terminal batteries, and then to automatically maintain the terminal batteries substantially at their fully charge or 'topped off' state while safeguarding the batteries against detriment to their optimum useful life.

Figure 37:
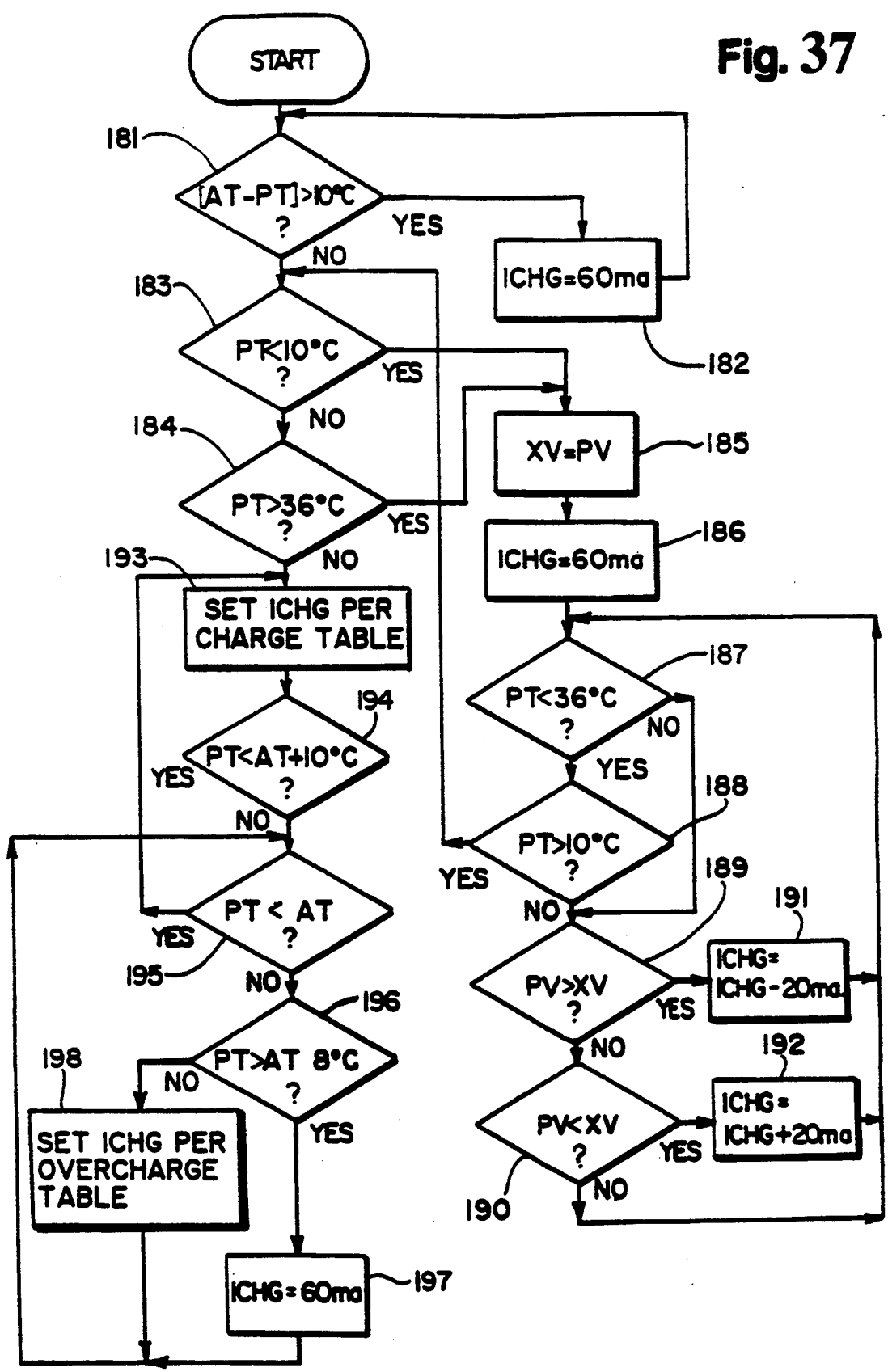
FIG. 37 shows an improved procedure for carrying out fast charging and maintenance of a nickel-cadmium battery pack, for example in conjunction with a microprocessor system as shown in FIG. 28, the variable P temp, V batt and Atemp of FIG. 28 being represented by PT, PV and AT in FIG. 37.
Figure 38:
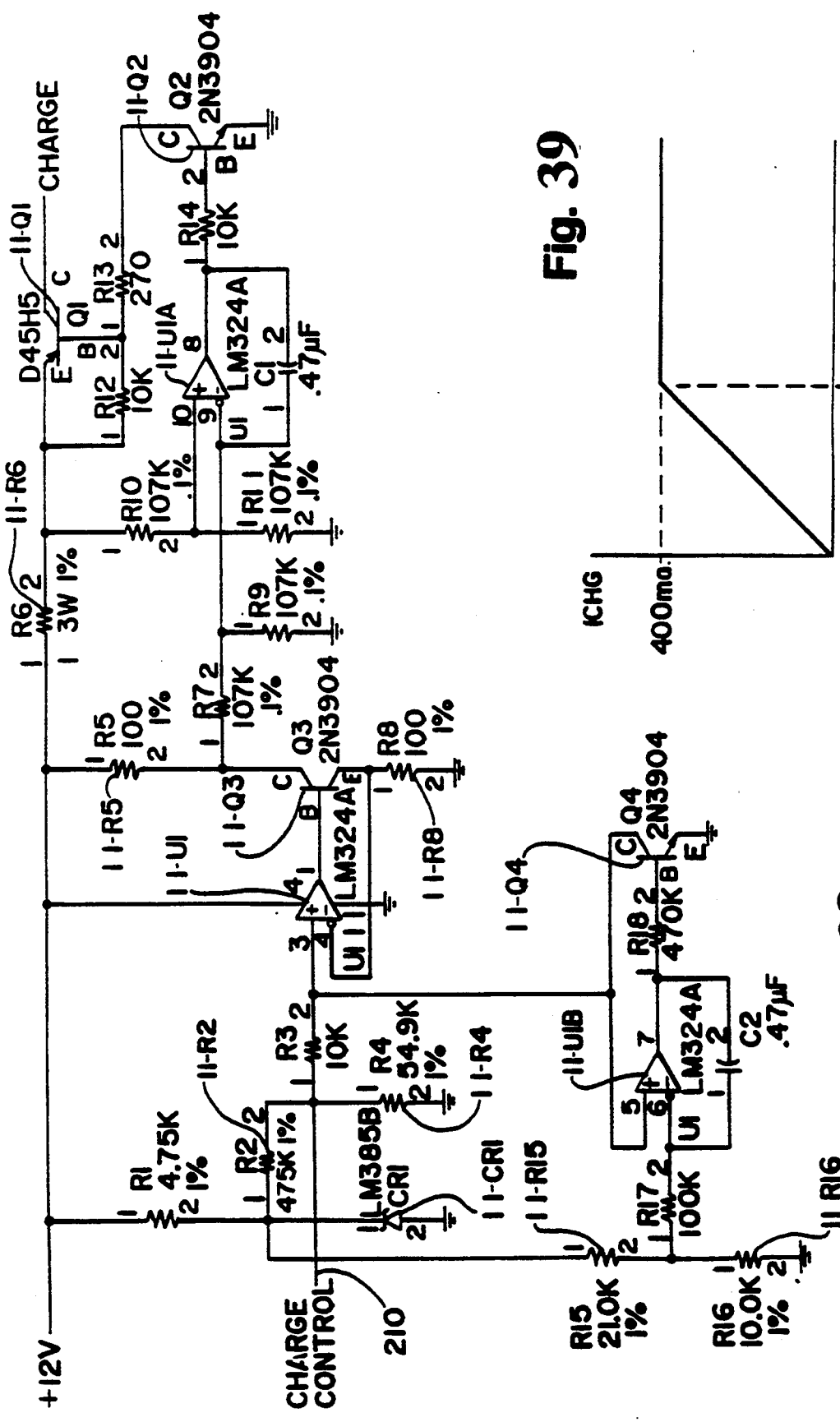
FIG. 38 is a schematic diagram for illustrating a charge current regulator circuit such as indicated at 28-20 in FIG. 28.
Figure 39:
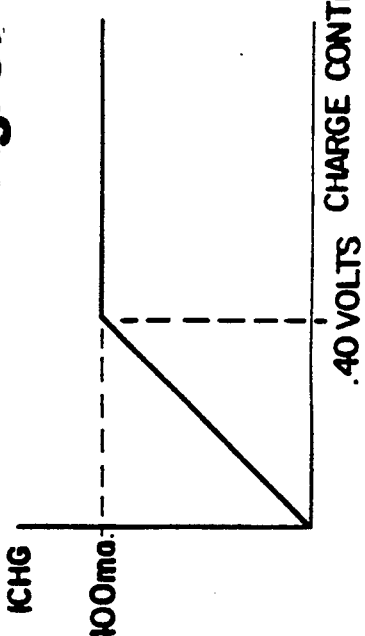
FIG. 39 shows the voltage to current transfer function for the circuit of FIG. 38.

The above stated objectives for a battery charging system have traditionally been extremely difficult to achieve. FIGS. 37, 38 and 39 show an embodiment that addresses both aspects of fast charging and maintenance in a novel and unique way.

As described with reference to FIGS. 28 through 36, the characteristics of the popular NiCad battery technology are such that the rates at which charging may be accomplished are a strong function of temperature and state of charge. If the cell is in a discharged condition, the rate at which charge may be applied is relatively high, regardless of the cell temperature. If the cell is in a charged condition, the rate at which charge may be applied to the cell is determined by the temperature of the cell. At the limits of cell temperature, excessive charge current may cause permanent damage resulting in premature failure of the cell. Consequently, for fast charging to be accomplished safely, the temperature and state of charge of a battery must be determined.

Battery temperature (herein designated PT) may be measured directly by the use of a pack temperature sensor 28-16 thermally coupled to the battery pack 28-25. State of charge of a NiCad battery type is more difficult to determine. In general, the most reliable indication that a NiCad battery is fully charged is the release of heat while under charge. This only occurs when the battery is in the overcharge condition in which most or all of the current supplied to the battery causes evolution of oxygen gas at the positive electrode. When oxygen chemically recombines with cadmium at the negative electrode, heat is released. N. other condition of operation of a NiCad battery causes appreciable heat to be generated.

In general, the process of converting charge current to stored charge in a NiCad battery is a slightly endothermic chemical reaction, that is, heat is removed from the environment of the battery and it gets slightly cooler. Consequently, it is possible to apply quite high rates of charge to the battery if it is not in the overcharge condition. Once the overcharge condition is reached, the slightly endothermic charge reaction is overwhelmed by the highly exothermic overcharge/oxygen recombination reaction. The rate of applied charge must then be quickly reduced to prevent excessive heating and battery damage As described in reference to FIGS. 28-36, a microcomputer 28-10 with the ability to measure the temperature of a battery and control the applied charge to that battery may be employed to effect charging at the maximum safe (non-damaging) rate and may also terminate the charge function to prevent damage to the battery when it is fully charged. The present embodiment also employs a microcomputer to measure battery temperature and control applied charge as indicated in FIG. 28, however, the process that is used to determine the appropriate charge current is quite substantially different, and significantly modifies and improves the performance of the charging system.

A flow diagram of the procedure that accomplishes the described charging characteristics is shown in FIG. 37. It should be noted that the charging method described may be applied to either a terminal or utilization device with the circuits as shown in FIG. 28 or to a standalone pack charger with one or more sets of the same circuit. In the case of the pack charger configuration, the block 28-21 labeled "load" would not be present. In the terminal configuration the operating power required by the terminal itself would represent a load that requires current to be delivered by the charge circuit or battery.

In FIG. 37, the initial decision block 37-1, |AT-PT↑ >10° C., provides two pieces of information based on the ambient temperature value, AT, from sensor 28-17, and battery pack temperature PT. The first information (when the temperature difference is not greater than ten degrees celsius) is that the temperature sensors 28-16 and 28-17 are in at least approximately agreement (which provides confidence that they are functioning properly). If the temperature difference is relatively great, it is possible that the battery pack and the charger are at significantly different temperatures, in which case they need to stabilize to an acceptable level before further procedure steps may be taken. If this condition is detected, a constant current of sixty milliamperes (60 ma.) is selected as indicated at 37-2 to provide a safe low maintenance current that may minimize further discharge of the battery if it is already in a relatively depleted state.

If the initial temperature difference is not excessive, the absolute temperature of the battery pack is examined at steps 37-3 and 37-4. The temperature range allowed for charging is between 10° C. and 36° C. If the battery temperature is not within this range, the battery must be allowed to cool or warm as the case may be for the charging process to continue. It may be assumed (or specified) that the ambient temperature environment of the charger itself is between these limits, so that the battery temperature will stabilize after some time to an acceptable level. During this temperature stabilization time, it is preferable that no charge current be supplied to the battery, though it may be necessary for current to be supplied to a load, as in the case of a terminal which receives its operating power from the battery or charge while charging is in progress. Since the load current is generally not known, a mechanism must be provided to adjust the current provided by the charger to accurately match the load current of the terminal. The means by which this is accomplished is as follows:

1. Examine the battery pack terminal voltage designated PV as indicated at block 37-5.
2. Select an initial charge current of sixty milliamperes (60 ma.) as indicated at 37-6.
3. Examine the pack temperature PT at 37-7 and 37-8 to determine if it has stabilized within the desired limits. If so, return to the main charging process.
4. Examine the present terminal voltage PV at 37-9 and 7-10.
5. If the battery terminal voltage has increased, decrease the charge current by twenty milliamperes (20 ma.) as indicated at 37-11.
6. If the battery terminal voltage has decreased, increase the charge current by twenty milliamperes (20 ma.) as indicated at 37-12.
7. If no terminal voltage change is detected, leave the charge current unchanged and return to step 3 above (referring to entry into the flow diagram of FIG. 37 at 187 and 188). This method serves to provide an adaptive current that will prevent the battery from being further depleted while its temperature stabilizes to an allowable level.

After the battery temperature has stabilized to an allowable level, it is then possible to begin charging at high rates of charge. As described with reference to FIGS. 28-36, a stored table containing values of currents that may be safely applied to a battery of a known capacity at a given temperature is used to determine the charge current, this being indicated at 37-13. While the table values for fast charge current will not cause stress or damage to a battery when it is discharged and efficiently receiving charge, in general, these charge currents are high enough to cause permanent damage to the battery if not terminated properly. The indication that the battery is nearing full charge is based on detection of the overcharge condition, which is the only condition of a NiCad cell that releases significant heat. In flow diagram block of FIG. 37, the condition for decision block 37-14, PT<AT+10° C., provides the test for overcharge detection. In essence, the test for overcharge is to detect that the battery is becoming warmer than the ambient environment, in this case by an amount of ten degrees celsius (10° C.). When this amount of heating is detected indicating that the battery has reached the overcharge condition in an appreciable degree, the fast charge function is terminated.

Upon completion of fast charge, a maintenance charge function is initiated which continues to monitor the battery temperature rise above the ambient environment (step 37-15) and maintains an applied overcharge current at a level that regulates that battery temperature rise. The overcharge temperature rise is held to eight degrees celsius (8° C.) as shown by steps 37-16, 37-17, and 37-18; this being a safe sustainable level that may be maintained indefinitely without appreciable cumulative damage to the battery. The temperature regulation process is implemented by selecting between a low charge current of sixty milliamperes (60 ma.) and the higher overcharge current table value depending on the measured temperature rise. By maintaining the battery in a state of continuous safe overcharge, it is possible to hold the battery in its maximum state of charge when it has been returned to the charger, thereby ensuring that the user has the full battery capacity available whenever needed. If the battery temperature falls below the ambient temperature as determined at step 37-15, the fast charge state will be re-entered which will apply the maximum safe charge current for the measured temperature. It should be noted that this situation might occur if a very warm battery pack is placed in a pack charger at nominal temperature. Initially if the temperature difference is greater than 10° C. the pack will be charged at a fixed current of 60 ma until the temperature difference is reduced. If the pack temperature is less than 36 degrees C. at this time, its temperature difference may still be very close to 10 degrees C. which might allow the process to advance to the final maintenance state of the charge system. As the pack cools further due to ambient cooling and the endothermic charging reaction, its temperature may go below the ambient temperature (step 37-15), at which point the fast charge state would be re-entered.

In the maintenance mode, the current required operation of a terminal is provided by the fact that the charge current (step 37-17 or 37-18) will exceed the terminal operating current by an amount necessary to maintain the temperature rise of the battery. Consequently, this charging system provides broad flexibility for fast charging of NiCad batteries in utilization devices with widely varying current demands.

A useful feature of this charging method is that it is not critical that the charging voltage source be able to provide the maximum current specified by the controlling microcomputer, for reliable charging to be accomplished. For example, if the selected value of charge current for a certain battery pack is 1500 ma., but the voltage source has a current capacity of only 600 ma., the fast charge state of the procedure would be maintained in exactly the same way except it would take correspondingly longer for the overcharge state to be reached. This feature of the charging method is particularly useful in configurations where multiple battery packs may be charged in a single unit and it is necessary to place constraints on the unit power supply for economic or size reasons. It is a relatively simple matter to externally limit the maximum delivered current so that the actual charge current is less than the value selected by the controlling microcomputer.

FIG. 38 shows a schematic diagram of a charge current regulator circuit which has the capability of delivering a constant current output to a battery in proportion to an input control voltage. In addition, this circuit has a maximum delivered current limit that may be set by a resistor selection in power supply constrained applications.

The CHARGE CONTROL input 38-10 is intended to be driven by a digital to analog (D/A) converter out put of a microcomputer based utilization device such as a data terminal. The CHARGE CONTROL input develops a control voltage at pin 3 of differential amplifier 38-U1. The output pin 1 of 38-U1 drives 38-Q3 which establishes a current through 38-R8 that develops a voltage at 38-UI, pin 4 equal to the voltage at 38-U1, pin 3. Since the current gain $h_{fe}$ of 38-Q3 is relatively high (about 200) the collector current of 38-Q3 is nearly equal to the emitter current, resulting in an equal current through both 38-R5 and 38-R8. Since these resistors are of equal magnitude, the input voltage at CHARGE CONTROL 38-10 appears across 38-R5 referenced to the +12 volt supply voltage. The amplifier at 38-U1A pins 8, 9 and 10 is a differential configuration operating in a negative feedback mode. With a voltage developed across 38-R5, the voltage at pin 9 of 38-U1A will be decreased, which increases the voltage at the output pin 8. This increased voltage drives current into 38-Q2 which increases the drive current to 38-Q1 establishing a current through current sense resistor 38-R6. When the voltage drop across 38-R6 equals the voltage across 38-R5, the amplifier output will stabilize, holding the output current constant. With a sense resistor value of one ohm at 38-R6, the voltage to current conversion factor is one ampere per volt (1 amp.-/volt). If the CHARGE CONTROL input is left unconnected, the 1.25 volt voltage reference 38-CR1 and resistors 38-R2 and 38-R4 establish an open circuit voltage of 0.120 volts which establishes a "default" output current of 120 ma. This condition may be useful in cases where a utilization device is either unintelligent or its battery is completely depleted in which case its processor is unable to operate and the battery must be brought up to at least minimal capacity for the processor to function.

The circuit block consisting of the amplifier at 38-U1B pins 5, 6 and 7 is a clamp circuit that limits the maximum voltage that may be applied to 38-U1, pin 3 By limiting the input voltage, the maximum available charge current may then be limited to some selected value dependent on the selection of 38-R15 and 38 R16. With values of twenty-one kilohms for 38 R15 and ten kilohms for 38-R16, a voltage of 0.40 volts is applied to the clamp circuit input. If the input voltage driven on CHARGE CONTROL is less than 0.40 volts, the output pin 7 of 38-U1B remains low which biases 38-Q4 off. If the CHARGE CONTROL input voltage reaches or exceeds 0.40 volts, 38-Q4 is turned on sufficiently to maintain a voltage of exactly 0.40 volts at 38-U1B pin 5 which prevents the input voltage to the control amplifier from exceeding this voltage. The voltage to current transfer function of the system is shown in FIG. 39. It should be noted that the clamp voltage and maximum available current may be modified by selecting different values for 38-R15 and 38-R16 or the voltage reference 38-CR1. A maximum available current of 1.25 amps may be implemented by deleting 38-R16 in which case the full reference voltage appears at the clamp circuit input.

The microprocessor system means 28-10 or 32-10 operates automatically to apply substantially maximum charging current to the battery means consistent with avoiding substantial detriment to the useful life of the battery means e.g. as represented in FIG. 34.

A basic step of each embodiment is to compare battery temperature and ambient temperature as represented at 29-18 and 37-1. As indicated by FIG. 36, where ambient temperature is 20° C. (68° F.), the increase in battery temperature because of higher ambient temperature is relatively moderate for an initial battery temperature approaching 10° C. (50° F.). Thus, if battery temperature is at least 10° C. (step 37-3), and if ambient temperature is within 10° C. of battery temperature (step 370-), a substantial charging current may be supplied (37-13) even if the battery has not previously been checked for the overcharge condition (as in steps 29-20 to 29-23).

In each embodiment, charging current may be applied according to a fast charge characteristic such as shown in FIG. 34.

For step 37-13, it has already been ascertained that battery temperature is between 10° C. and 36° C., a region of the overcharge characteristic of FIG. 33 which is least sensitive to charging current. Further, in each embodiment current is applied for only a limited time interval, e.g. one minute or less (see step 29-25), before battery temperature is read again for the purpose of detecting a change of battery temperature indicative of the overcharge condition.

For step 29-27 an increase in battery temperature of two degrees Celsius or greater is taken as an indication of the overcharge condition.

For steps 37-14 to 37-156, the battery temperature is initially less than 10° C. greater than ambient temperature (step 37-1), so that if battery temperature increases so as to be equal or greater than the sum of ambient temperature and 10° C., this can be taken as indicating the overcharge condition. The comparison to ambient temperature plus 10° C. at step 37-14 can take place frequently, e.g. at one minute intervals where steps 37-13 and 37-14 are repeated cyclically.

Step 37-17 can taken as setting a current value corresponding to 0.2C (C equals 1200 milliampere-hours) which according to Table II would be suitable for temperatures between about −25°0 C. and 60° C. Since ambient temperature is assumed to be maintained between 10° C. and 36° C., a low value of sixty milliamperes would be suitable for Table I also, even assuming no current being taken by load 28-21

In each embodiment, measurement of battery terminal voltage is utilized to obtain a measure of load current. In FIG. 29, this is accomplished by increasing current in steps of say ten milliamperes (at 29-8) and sensing when battery voltage increases (step 29-11).

In FIG. 37, an initial current value of sixty milliamperes (step 37-6) is increased or decreased as measured battery voltage fluctuates in comparison to a reference value (XV, step 37-5). Thus, the current supplied is roughly equal to the required load current until such time as battery temperature increases above 10° C.

Discussion of the Embodiment of FIG. 37

Steps 29-1 to 29-12 are not inconsistent with the processing steps of FIG. 37, and could be used therein to identify a given battery pack, and/or to determine terminal load current during charging.

Steps 29-7 to 29-14 could be substituted for step 37-4 if desired.

Also, step 29-14 could be used in place of step 37-6, whereupon, steps 37-9 to 37-12 could be omitted. Steps 29-14 could also be substituted for step 37-2 or step 37-17.

It may be helpful to give the operation of FIG. 37 for the case of a specific example. If ambient temperature of the charge system which is to receive a terminal or battery pack is 20° C. (68° F.) and the pack is initially at 0° C. (32° F.), step 37-2 will apply until the battery pack reaches a temperature of 10° C. (50° F.). At this time, the temperature differential will be 10° C., and step 37-13 will be executed. For a battery according to Table II, the value of fast charging current would be 1.314C. This value would also be selected based on characteristic of FIG. 34.

Step 37-14 could be performed at suitable time intervals, e.g., one minute intervals While battery temperature remained below 30° C., the fast charge rate would be successively adjusted (step 37-13) at e.g. one minute intervals according to Table II if necessary. Between 14° C. and 30° C., the fast charge rate might be at 1.600C., as also indicated in FIG. 37, where such a charge rate was available from the regulator circuit.

It will be apparent that features of the various embodiments described or incorporated herein may be combined, ant that various of the features may be utilized independently of others, and that many further modifications and variations may effected without departing from the scope of the teachings and concepts of the present disclosure.

I claim as my invention:

1. In a battery conditioning system,
    (a) rechargeable battery means for supplying operating current during a number of hours of portable operation so as to become progressively discharged as a result,
    (b) battery conditioning system means for coupling with said rechargeable battery means for supplying current to said rechargeable battery means during a battery conditioning cycle, after a period of portable operation,
    (c) said battery conditioning system means comprising computer means having input means for receiving measures of battery temperature at successive times during such battery conditioning cycle, and
    (d) current control means for coupling with said rechargeable battery means for controlling the rate of current flow to the rechargeable battery means during a battery conditioning cycle,
    (e) said computer means having output means coupled with said current control means for varying the rate to said rechargeable battery means during conditioning cycle as a function of said measures of battery temperature as monitored by said computer means,
    (f) said current control means providing a relatively low rate of current flow to said battery means suitable for a relatively low value of battery temperature during overcharge of the battery means, and providing a multiplicity of different higher rates of current flow to said battery means each of which is higher than said relatively low rate of current flow, and each of which is suitable for a respective different higher value of battery temperature during overcharge of said battery means,
    (g) said computer means being responsive to one of said measures of battery temperature representative of said relatively low value of battery temperature to select said relatively low rate of current flow to said battery means, and being responsive to respective others of said measures of battery temperature representing the respective different higher values of battery temperature to select respective ones of said multiplicity of different higher rates of current flow to said battery means, such that said battery conditioning cycle can be carried out under a wide range of environmental conditions while yet assuring a battery conditioning cycle which is suitable during overcharge of said battery means.

2. In a battery conditioning system according to claim 1, said current control means having about ten or more of said different higher rates of current flow to said battery means corresponding to battery charge rates greater than C/20 but less than C/5 where C represents the rated capacity of said battery means.

3. In a battery conditioning system according to claim 2, said rechargeable battery means comprising nickel-cadmium rechargeable battery means having a rated capacity of about two ampere-hours.

4. In a battery conditioning system according to claim 1, said rechargeable battery means comprising nickel-cadmium rechargeable battery means.

5. In a battery conditioning system according to claim 1, said computer means automatically controlling said current control means in response to said one of said measures of battery temperature so as to avoid extended overcharging of the rechargeable battery means at a rate exceeding rated capacity divided by twenty.

6. In a battery conditioning system according to claim 1, said computer means automatically operating in response to said one of said measures representative of said relatively low value of battery temperature so as to avoid substantial extended overcharging of the battery means at said relatively low value of battery temperature while providing respective progressively increased values of overcharge current for said others of said measures of battery temperature representing said respective different higher values of battery temperature over a substantial range lying above said relatively low value of battery temperature.

7. In a battery conditioning system according to claim 6, said battery means comprising nickel-cadmium battery means, and said computer means being automatically operative in response to said others of said measures of battery temperature to supply overcharge current values as a function of battery temperature between capacity divided by approximately twenty and capacity divided by approximately five.

8. In a battery conditioning system according to claim 1, said computer means automatically operating in response to said measures of battery temperature to provide respective successively increased rates of current flow to said battery means such that overcharge current is increased by a factor of at least four for the highest of the respective different higher values of battery temperature in comparison to said relatively low rate of current flow.

9. In a battery conditioning system according to claim 8, said battery means comprising a nickel-cadmium battery means.

10. In a battery conditioning system according to claim 1, said computer means automatically determining whether said battery means is in an overcharge condition, and when said battery means is not in overcharge condition selecting from a schedule of still higher rates of current flow to said battery means as a function of said measures of battery temperature, said still higher rates of current flow being respectively higher than overcharge of said battery means.

11. In a battery conditioning system according to claim 10, said computer means in determining whether said battery means is in said overcharge condition applying said relatively low rate of current flow for said relatively low value of battery temperature until such time as said one of said measures of battery temperature at least approximates ambient temperature.

12. In a battery conditioning system according to claim 10, said computer means in determining whether said battery means is in said overcharge condition applying said higher rates of current flow for said respective different higher values of battery temperature until such time as said one of said measures of battery temperature at least approximates the ambient temperature.

13. In a battery conditioning system according to claim 1, said computer means automatically comparing said measures of battery temperature with the ambient temperature, and when said battery temperature is not substantially less than the ambient temperature, applying a rate of current flow to said battery means as a function of said measures of battery temperature which is substantially higher than the respective rates of current flow as a function of said measures of battery temperature which are selected by said computer means during overcharge of said battery means.

14. In a battery conditioning system according to claim 1, said computer means having stored tables of suitable rates of current flow to said battery means as a function of said measures of battery temperature during overcharge of said battery means comprising said relatively low rate of current flow and said multiplicity of different higher rates of current flow.

15. In a battery conditioning system according to claim 13, said computer means having stored tables of suitable rates oi current flow to said battery means as a function of said measures of battery temperature during overcharge of said battery means comprising said relatively low rate of current flow and said multiplicity of different higher rates of current flow.

16. In a battery conditioning system according to claim 10, said computer means having stored tables of suitable rates of current flow to said battery means as a function of said measures of battery temperature during overcharge of said battery means comprising said relatively low rate of current flow and said multiplicity of different higher rates of current flow.

17. In a battery charging system,
(a) rechargeable battery means,
(b) external terminals of opposite polarity for the rechargeable
battery means,
(c) external circuit means between said rechargeable battery means and said external terminals of opposite polarity, said external circuit means having essentially negligible ohmic resistance and connecting said external terminals of opposite polarity with said battery means,
(d) load means at a load side of said external terminals, said external terminals having said load means connected there across at the load side of said external terminals such that said battery means supplies load current to said load means via said external circuit means with minimized ohmic loss at the battery side of said terminals, and
(e) automatically operating programmed system means comprising
(e1) automatically operating processing means coupled with said external terminals for reading battery terminal voltage, and for increasing charging current to said battery means in successive steps to determine any load current being supplied to load means, and (e2) automatically operating control means operating to apply substantially maximum charging current to said battery means consistent with avoiding substantial detriment to the operating life thereof while additionally supplying any required load current.

18. In a battery charging system according to claim 17, said automatically operating programmed system means comprising said automatically operating control means reading battery temperature and essentially supplying to said external terminals only the required load current so long as battery temperature exceeds a given upper limit temperature value.

19. In a battery charging system according to claim 17, said automatically operating control means insuring that battery temperature is above a selected minimum temperature value before applying said substantially maximum charging current to said battery means.

20. In a battery charging system according to claim 18, said automatically operating control means determining that battery temperature is within a given temperature range below said given upper limit temperature value, and then applying an excess overcharge current to said battery means which exceeds a substained overcharge rating of the battery means while limiting the time of application of said excess overcharge current to a time sufficient to detect the charge condition of the battery means without substantial detriment to the operating life thereof.

21. In a battery charging system according to claim 20, said automatically operating control means after detection of an overcharge condition of the battery means reducing overcharge current to a value according to said sustained overcharge rating of said battery means.

22. In a battery charging system according to claim 17, said automatically operating control means having means for automatically identifying a sustained overcharge current rating for said battery means.

23. In a battery charging system according to claim 17, said automatically operating control means insuring that battery temperature is above a selected minimum temperature value before applying said substantially maximum charging current to said battery means.

24. In a battery charging system according to claim 17, said automatically operating control means determining that battery temperature is within a given temperature range below a given upper limit temperature value, and then applying an excess overcharge current to said battery means which exceeds a sustained overcharge rating of the battery means while limiting the time of application of said excess overcharge current to a time sufficient to detect the charge condition of the battery means without substantial detriment to the operating life thereof.

25. In a battery charging system according to claim 24, said automatically operating control means after detection of an overcharge condition of the battery means reducing overcharge current to a value according to said sustained overcharge rating of said battery means.

26. In a battery charging system according to claim 17, said automatically operating control means having means for automatically identifying a sustained overcharge current rating for said battery means, and automatically supply an overcharge current according to said sustained overcharge rating to said battery means when said battery means has attained an overcharge condition.

27. In a battery charging system,
(a) rechargeable battery means,
(b) external terminals of opposite polarity for the rechargeable battery means,
(c) external circuit means between said rechargeable battery means and said external terminals of opposite polarity, said external circuit means connecting said external terminals of opposite polarity with said battery means,
(d) load means at a load side of said external terminals having said load means connected there across at the load side of said external terminals such that said battery means supplies load current to said load means via said external circuit means at the battery side of the said terminals, and
(e) automatically operating programmed system means comprising automatically operating control means operating to apply substantially maximum charging current to said battery means consistent with avoiding substantial detriment to the operating life thereof,
(f) said automatically operating control means having means for automatically identifying a sustained overcharge current rating for said battery means, and automatically supplying an overcharge current according to said sustained overcharge rating to said battery means when said battery means has attained an overcharge condition.

28. In a battery charging system according to claim 27, said automatically operating system means comprising said automatically operating control means reading battery temperature and essentially supplying to said external terminals only any required load current so long as battery temperature exceeds a given upper limit temperature value.

29. In a battery charging system according to claim 27, said automatically operating control means insuring that battery temperature is above a selected minimum temperature value before applying said substantially maximum charging current to said battery means.

30. In a battery charging system according to claim 27, said automatically operating control means determining that battery temperature is within a given temperature range below a given upper limit temperature value, and then applying an excess overcharge current to said battery means which exceeds the sustained overcharge rating of the battery means while limiting the time of application of said excess overcharge current to a time sufficient to detect the charge condition of the battery means without substantial detriment to the operating life thereof.

31. In a battery charging system according to claim 30, said automatically operating control means after detection of an overcharge condition of the battery means reducing overcharge current to a value according to said sustained overcharge rating of said battery means.

32. In a battery charging system,
(a) rechargeable battery means,
(b) external terminals of opposite polarity for the rechargeable battery means,
(c) external circuit means between said rechargeable battery means and said external terminals of opposite polarity, said external circuit means connecting said external terminals of opposite polarity with said battery means, (d) load means at a load side of external terminals, said external terminals having said load means connected there across at the load side of said external terminals such that said battery means supplies load current to said load means via said external circuit means at the battery side of said terminals, and (e) automatically operating programmed system means comprising automatically operating control means operating to apply substantially maximum charging current to said battery means consistent with avoiding substantial detriment to the operating life thereof, (f) said automatically operating control means determining that battery temperature is within a given temperature range below a given upper limit temperature value, and then applying an excess overcharge current to said battery means which exceeds a sustained overcharge rating of the battery means while limiting the time of application of said excess overcharge current to a time sufficient to detect the charge condition of the battery means without substantial detriment to the operating life thereof.

33. In a battery charging system according to claim 32, said automatically operating control means after detection of an overcharge condition of the battery means reducing overcharge current to a value according to the sustained overcharge rating of said battery means.

34. In a battery charging system according to claim 32, said automatically operating control means having means for automatically identifying the sustained overcharge current rating for said battery means.

35. In a battery charging system according to claim 32, said automatically operating system means comprising said automatically operating control means reading battery temperature and essentially supplying to said external terminals only any required load current so long as battery temperature exceeds a given upper limit temperature value.

36. In a battery charging system according to claim 32, said automatically operating control means insuring that battery temperature is above a selected minimum temperature value before applying said substantially maximum charging current to said battery means.

37. The method of charging a battery pack comprising (a) applying a charge increment to a rechargeable battery means, (b) measuring a parameter sensitive to accumulation of charge by the battery means, (c) repeating steps (a) and (b) as necessary to effect a determination of any load current being supplied by the battery means, and (d) initiating a battery charging operation by supplying to the battery means a charging current taking account of any load current as determined by step (c) while enabling connections of minimum ohmic resistance between the battery means and the load.

38. Apparatus for charging a battery means, said apparatus comprising (a) operating means for automatically obtaining measures of ambient temperature and of battery temperature of the battery means, (b) said operating means automatically comparing the measures of the ambient temperature and said battery temperature, and when said measures show that said battery temperature is not substantially less than the ambient temperature, automatically applying current to the battery means of a substantial overcharge magnitude greater than a sustainable overcharge current, but of a limited duration such as to avoid substantial detriment to the useful life of the battery means even when in overcharged condition, (c) said operating means repeatedly automatically obtaining said measures of the battery temperature and sensing any change in said measures of the battery temperature which is distinctive of the overcharge condition of the battery means so as to automatically determine whether or not the battery means is in overcharge condition, and (d) means automatically applying a relatively high charge rate to said battery means while the battery means is not in the overcharge condition, and applying a relatively lower charge rate to said battery means when the battery means is in the overcharge condition.

39. Apparatus according to claim 38 with said operating means automatically comparing the measures of the battery temperature of said battery means and the ambient temperature, and if said measures show that the battery temperature is sufficiently lower than the ambient temperature that battery temperature will increase at a substantial rate due to ambient temperature higher than said battery temperature, delaying the application of said current of said substantial overcharge magnitude until said measures show that the battery temperature is approximately equal to said ambient temperature.

40. Apparatus according to claim 39, with said operating means automatically applying a current substantially less than said substantial overcharge magnitude to said battery means so as to increase said battery temperature before applying said current of said substantial overcharge magnitude, when said battery temperature is initially substantially lower than the ambient temperature.

41. A method of charging a battery means, said method comprising (a) insuring that battery temperature of the battery means is not substantially less than the ambient temperature, and that the battery means will exhibit a substantially greater increase in said battery temperature when subjected to current of a substantial overcharge magnitude when it is in an overcharged condition than when it is not in said overcharged condition, (b) automatically applying current to the battery means of said substantial overcharge magnitude, but of a limited duration such as to avoid substantial detriment to the useful life of the battery means even when in said overcharged condition, (c) automatically measuring said battery temperature and sensing any change of the battery temperature due to step (b) which is distinctive of said overcharged condition of the battery means so as to automatically determine whether or not the battery means is in said overcharged condition, and (d) automatically according to the result of step (c), applying a relatively high charge rate to said battery means while the battery means is not in said overcharged condition, and applying a relatively lower charge rate to said battery means when the battery means is in said overcharged condition.

42. The method of charging according to claim 41 with step (a) comprising
   (a1) automatically comparing said battery temperature of said battery means with the ambient temperature and if said battery temperature is sufficiently lower than the ambient temperature so that it will increase at a substantial rate due to a higher ambient temperature than said battery temperature, delaying the application of said current of said substantial overcharge magnitude until the battery temperature is more nearly equal to the ambient temperature.

43. The method of charging according to claim 42, with step (a) further comprising
   (a2) if step (a1) shows said higher ambient temperature, automatically applying a current to the battery means substantially less than said substantial overcharge magnitude so as to increase the battery temperature.

44. The method of charging according to claim 43 with step (a) additionally comprising
   (a3) intermittently repeating step (a1) until said battery temperature is sufficiently high to enable the sensing of said overcharged condition by means of steps (b) and (c).

45. In a battery conditioning system,
   (a) rechargeable battery means for supplying operating current during portable operation so as to become progressively discharged as a result,
   (b) battery conditioning system means for coupling with said rechargeable battery means for supplying current to said rechargeable battery means during a battery conditioning cycle, after a period of portable operation,
   (c) said battery conditioning system means comprising computer means having input means for receiving measures of battery and ambient temperature at successive times during the battery conditioning cycle, and
   (d) current control means for coupling with said rechargeable battery means for controlling a current flow rate to the rechargeable battery means during the battery conditioning cycle,
   (e) said computer means having output means coupled with said current control means for varying the current flow rate to said rechargeable battery means during the battery conditioning cycle as a function of the battery temperature as monitored by said computer means,
   (f) wherein said computer means senses a differential between the ambient temperature and the battery temperature to insure a battery temperature rise will be essentially a function of an overcharge condition of the battery means as substantial current flow rates are supplied to the battery means during the battery conditioning cycle,
   (g) said computer means, including programming, and including connection means for obtaining a measure of battery voltage of the battery means from a battery voltage measuring means and automatically operating to provide respective successively increased values of the current flow rate to compensate for battery load, until such time as the battery voltage has stabilized, and maintaining the current flow rate which compensates for the battery load until the battery temperature has increased to a selected temperature value suited to fast charging operation.

46. In a battery conditioning system according to claim 45, said battery means comprising a nickel-cadmium battery means wherein the current supplied to the battery means becomes overcharge current when most of the supplied current causes generation of oxygen gas.

47. A method of charging a battery means having a temperature characteristic when subject to overcharge current which exhibits a rising temperature as a function of overcharge current duration, said method comprising:
   (a) insuring that the battery means has a state such that its temperature will not increase at a substantial rate due to a higher ambient temperature, and that the battery means will exhibit a substantially greater increase in battery temperature when subjected to the overcharge current than when subjected to a charging current when it is not overcharged, by monitoring both absolute temperature of the battery means and relative temperature between the battery means and ambient temperature, and automatically maintaining the battery temperature of the battery means within absolute and relative limits,
   (b) automatically applying non-static, non-preset charging current at a charge at any stage of recharging to the battery means of a substantial magnitude, but measuring the battery temperature within a time interval after applying the charging current such as to avoid substantial detriment to useful life of the battery means prior to such measurement,
   (c) automatically sensing any change of the battery temperature which is distinctive of an overcharge condition of the battery means so as to automatically determine whether or not the battery means is in the overcharge condition, and
   (d) automatically according to the result of step (c), applying a relatively high charge rate as a function of the battery temperature to said battery means while the battery means is sensed not to be in the overcharge condition, and applying a relatively lower charge rate to said battery means when the battery means is in the overcharge condition, and in each case selecting the charge rate so as to avoid substantial detriment to the useful life of the battery means,
   (e) measuring the ambient temperature and, after the battery means has reached the overcharge condition, the overcharge current flow rate is automatically adjusted according to the differential between the battery temperature and the ambient temperature, so as to maintain the battery means substantially in a fully charged condition.

48. The method of charging according to claim 47, where
   (e1) step (e) comprises applying the overcharge current according to a safe overcharge value as a function of the battery temperature, where the battery temperature does not substantially exceed the ambient temperature.

49. The method of charging according to claim 48,
   (e2) step (e) further comprises applying the overcharge current flow rate at a rate not substantially exceeding battery load current where the battery temperature substantially exceeds the ambient temperature.

50. The method of charging according to claim 49 with step
(e) comprising selecting between steps (e1) and (e2) in dependence upon whether the battery temperature exceeds the ambient temperature by a value of about eight degrees Celsius.

51. A method of charging a battery means which may have a load requiring current during charging operation, said method comprising
(a) measuring battery voltage to produce a measured value and applying moderate non-static, non-present charging current at any stage of recharging to the battery means,
(b) measuring battery temperature at successive times and determining whether the battery temperature is substantially outside a given temperature range before applying substantial charging current to the battery means, and if it is outside such temperature range,
(c) sensing whether the applied moderate charging current has increased the battery voltage, and
(d) increasing the charging current to the battery means a small increment where the battery voltage has not substantially increased within a given time interval.

52. In a method according to claim 51, repeating steps (b), (c) and (d) until such time as the battery voltage corresponds to the measured value, or the battery temperature is within said given temperature range.

53. In a method according to claim 51, repeating steps (b) and (c), and where the battery voltage has increased above the measured value, decreasing the moderate charging current to the battery means by a small increment, so that the battery voltage is maintained in the vicinity of the measured value until such time as the battery temperature is within the given temperature range, whereupon the substantial charging current may be applied.

54. A battery recharging system for recharging to and maintaining at maximum capacity a rechargeable battery comprising:
rechargeable battery means for providing a stored electric potential;
current control means for providing an adjustable recharging current to the battery means during a recharging period;
computer means for controlling the current control means and monitoring temperature of the battery means and ambient temperature;
input means included with the computer means for receiving successive measurements of the battery temperature and the ambient temperature at least during the recharging period;
output means included with the computer means for providing control signals to the current control means during the recharging period;
overcharge detection means associated with the computer means for automatically sensing a change of the battery temperature which is distinctive of an overcharge condition of the battery means; and
charge rate means associated with the computer means for automatically applying a relatively high charge rate of the recharging current, as a function of the battery temperature, to said battery means while the battery means is sensed not to be in the overcharge condition, and for applying a relatively lower charge rate of the recharging current to said battery means when the battery means is in the overcharge condition, and in each case selecting the charge rate so as to avoid substantial detriment to useful life of the battery means, said charge rate means dynamically and automatically adjusting the charging current as a function of the differential between the battery temperature and the ambient temperature to maintain the battery means in a substantially fully charged condition.

55. The system of claim 54 including switching means associated with the computer means for immediately changing the recharging current from the relatively high charge rate to the relatively lower charge rate upon detection of the overcharge condition.

56. A battery recharging system for recharging to and maintaining at maximum capacity a rechargeable battery comprising:
rechargeable battery means for providing stored electric potential for use by a load;
current control means for providing an adjustable recharging current to the battery means during a recharging period;
computer means for controlling the current control means and monitoring the battery means for an overcharge condition;
the computer means including input means for receiving repeated measurements of battery temperature and ambient temperature and output means for providing control signals to the current control means;
overcharge detection means associated with the computer means for automatically sensing any change of the battery temperature which is distinctive of the overcharge condition of the battery means so as to automatically determine whether or not the battery means is in the overcharge condition; and
charge rate means associated with the computer means for automatically and dynamically adjusting the recharging current to the battery means according to any ongoing differential between the battery temperature and the ambient temperature when the battery means has been sensed to have reached the overcharge condition, said charge rate means providing the battery means with a relatively low but variable rate of the recharging current to maintain the battery means substantially in a fully charged condition but to avoid substantial detriment to useful life of the battery means.

57. A method of charging a rechargeable battery means comprising:
measuring the difference between battery temperature of the battery means and ambient temperature;
applying a relatively low rate of charge current to the battery means if the battery temperature and the ambient temperature are not substantially close, to stabilize any temperature difference between the battery and ambient temperatures and prevent discharge of the battery means;
measuring the battery temperature to detect if the battery temperature is within a given temperature range to determine if the battery means is within an optimal charging temperature range;
applying a relatively moderate rate of charge current to the battery means if the battery temperature is outside the optimal charging temperature range, the relatively moderate rate dynamically varying as a function of the battery temperature to bring the battery temperature within the optimal charging temperature range;

applying a relatively high rate of charge current to the battery means if the battery temperature is within the optimal charging temperature range, the relatively high rate dynamically varying as a function of the battery temperature, the rate of charge current always being selected so as to avoid substantial detriment to useful life of the battery means;

measuring the difference between the battery temperature and the ambient temperature to sense any change of the battery temperature distinctive of an overcharge condition for the battery means; and applying the relatively low rate of charge current when the battery temperature is sensed to indicate an overcharge condition, the relatively low rate dynamically varying as a function of the battery temperature but always being selected so as to avoid substantial detriment to the useful life of the battery means.

58. A method for recharging a rechargeable battery means comprising:

measuring battery and ambient temperature at successive times;

stabilizing the battery means by causing any difference between the ambient temperature and the battery temperature to be substantially close;

causing the battery temperature to be within a given optimal charging temperature range by measuring the battery temperature, comparing the battery temperature with the given optimal charging temperature range, measuring battery voltage, and dynamically applying current at a variable charge rate determined as a function of the battery temperature and the battery voltage, if the battery temperature is outside the optimal charging temperature range to bring the battery temperature within the optimal charging temperature range prior to recharging;

dynamically applying a current to the battery at a relatively high variable charge rate once the battery temperature is within the optimal charging temperature range, the relatively high variable charge rate determined as a function of the difference between the battery temperature and the ambient temperature;

continuing to apply the relatively high variable charge rate for fast recharging of the battery means while repetitively measuring the battery temperature to sense any battery temperature change which is distinctive of an overcharge condition of the battery means; and applying a relatively lower charge rate selected between a predetermined non-varying charge rate if the battery temperature exceeds the ambient temperature by a substantial amount, and a varying charge rate dynamically varying as a function of battery temperature if the battery temperature does not exceed the ambient temperature by a substantial amount, to maintain the battery means in a fully charged condition, but avoiding substantial detriment to useful life of the battery means.

59. A method for fast charging of a rechargeable battery which deters damage to the battery during charging and maintains the battery in a fully charged capacity after charging, comprising:

measuring battery and ambient temperatures at successive times;

measuring battery voltage;

preparing the battery for optimal charging by applying a relatively non-varying low charge rate to the battery if the ambient temperature and the battery temperature differ by a substantial amount, and by applying a relatively low but varying charge rate which dynamically various as a function of the battery temperature and the battery voltage if the battery temperature is outside a given optimal charging temperature range;

charging the battery at a relatively fast charge rate which dynamically varies as a function of the battery temperature once the battery is prepared for optimal charging;

continuously monitoring the battery temperature during application of the relatively fast charge rate to detect any increase of the battery temperature which indicates an overcharge condition of the battery; and immediately switching the relatively fast charge rate to the relatively low charge rate upon detection of the overcharge condition, the relatively low charge rate dynamically varying as a function of the battery temperature to maintain the battery fully charged without substantial detriment to useful, life of the battery.

* * * * *